United States Patent [19]
Kozuka et al.

[11] Patent Number: 5,557,121
[45] Date of Patent: Sep. 17, 1996

[54] LAMINATED SOLID-STATE IMAGE SENSING APPARATUS AND METHOD OF MANUFACTURING THE SAME

[75] Inventors: Hiraku Kozuka, Hiratsuka; Shigetoshi Sugawa, Atsugi; Masato Yamanobe, Machida, all of Japan

[73] Assignee: Canon Kabushiki Kaisha, Tokyo, Japan

[21] Appl. No.: 388,894

[22] Filed: Feb. 14, 1995

Related U.S. Application Data

[63] Continuation of Ser. No. 973,953, Nov. 9, 1992, abandoned.

[30] Foreign Application Priority Data

Nov. 8, 1991 [JP] Japan ................................. 3-319697
Nov. 6, 1992 [JP] Japan ................................. 4-321410

[51] Int. Cl.⁶ ................... H01L 31/0328; H01L 27/148; H01L 31/062
[52] U.S. Cl. ........................ 257/292; 257/186; 257/233; 257/294
[58] Field of Search .................... 257/290, 186, 257/233, 292, 294; 250/208.1

[56] References Cited

U.S. PATENT DOCUMENTS

| 4,583,002 | 4/1986 | Kondo et al. | 250/578 |
|---|---|---|---|
| 4,633,287 | 12/1986 | Yamazaki | 257/186 |
| 4,791,469 | 12/1988 | Ohmi et al. | 357/30 |
| 4,933,731 | 6/1990 | Kimura | 357/30 |
| 5,179,430 | 1/1993 | Torikai | 257/186 |

FOREIGN PATENT DOCUMENTS

| 3829003 | 8/1987 | European Pat. Off. | H01L 27/14 |
|---|---|---|---|
| 59-119980 | 7/1984 | Japan | H04N 5/30 |
| 59-202777 | 11/1984 | Japan | H04N 5/30 |
| 62-92364 | 4/1987 | Japan | H01L 27/14 |
| 62-287071 | 12/1987 | Japan | C23C 14/34 |
| 2029642 | 3/1980 | United Kingdom | H01L 27/14 |

OTHER PUBLICATIONS

Solid State Technology, Dec. 1982, pp. 85–90, Nocholas E. Miller, "CVD Tungsten Interconnect and Contact Barrier Technology for VLSI".

*Primary Examiner*—Sara W. Crane
*Assistant Examiner*—Valencia Martin Wallace
*Attorney, Agent, or Firm*—Fitzpatrick, Cella, Harper & Scinto

[57] ABSTRACT

A solid-state image sensing apparatus including: a substrate having a charge storage portion capable of storing charges and an output circuit for outputting a signal in accordance with the charges stored in the storage portion; an insulating film formed on the surface of the substrate and having an opening formed above the charge storage portion; and a photosensitive layer formed on the insulating film and electrically connected to the charge storage portion via the opening, wherein an embedded region is formed within the opening and the surface of the insulating film and that of the embedded region are substantially flattened.

16 Claims, 14 Drawing Sheets

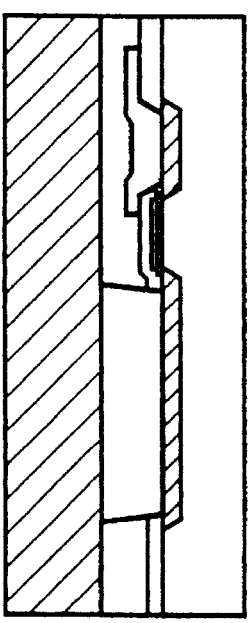
FIG.21D BL
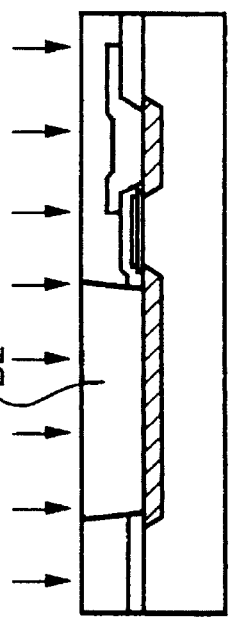
FIG.21E BL
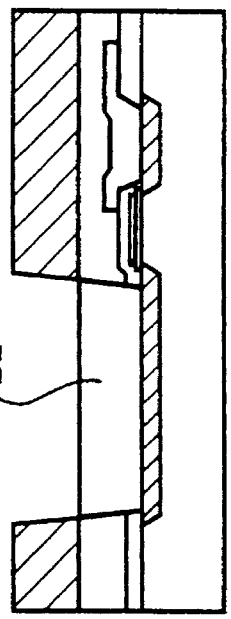
FIG.21F
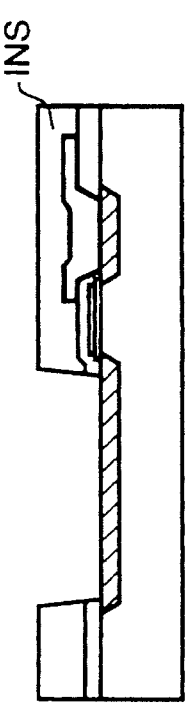
FIG.21A
INS
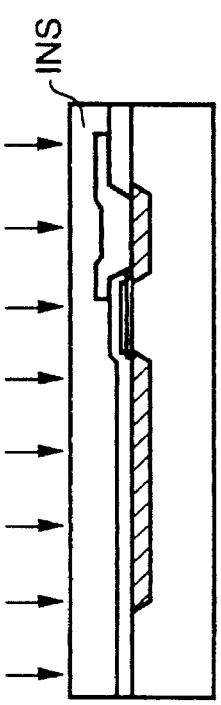
FIG.21B
INS
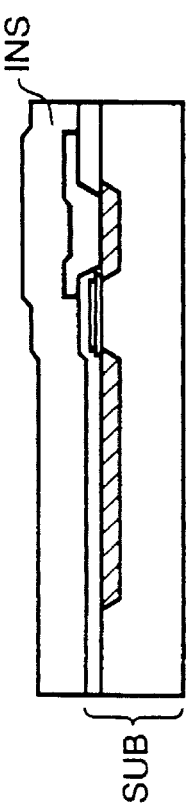
FIG.21C
INS
SUB

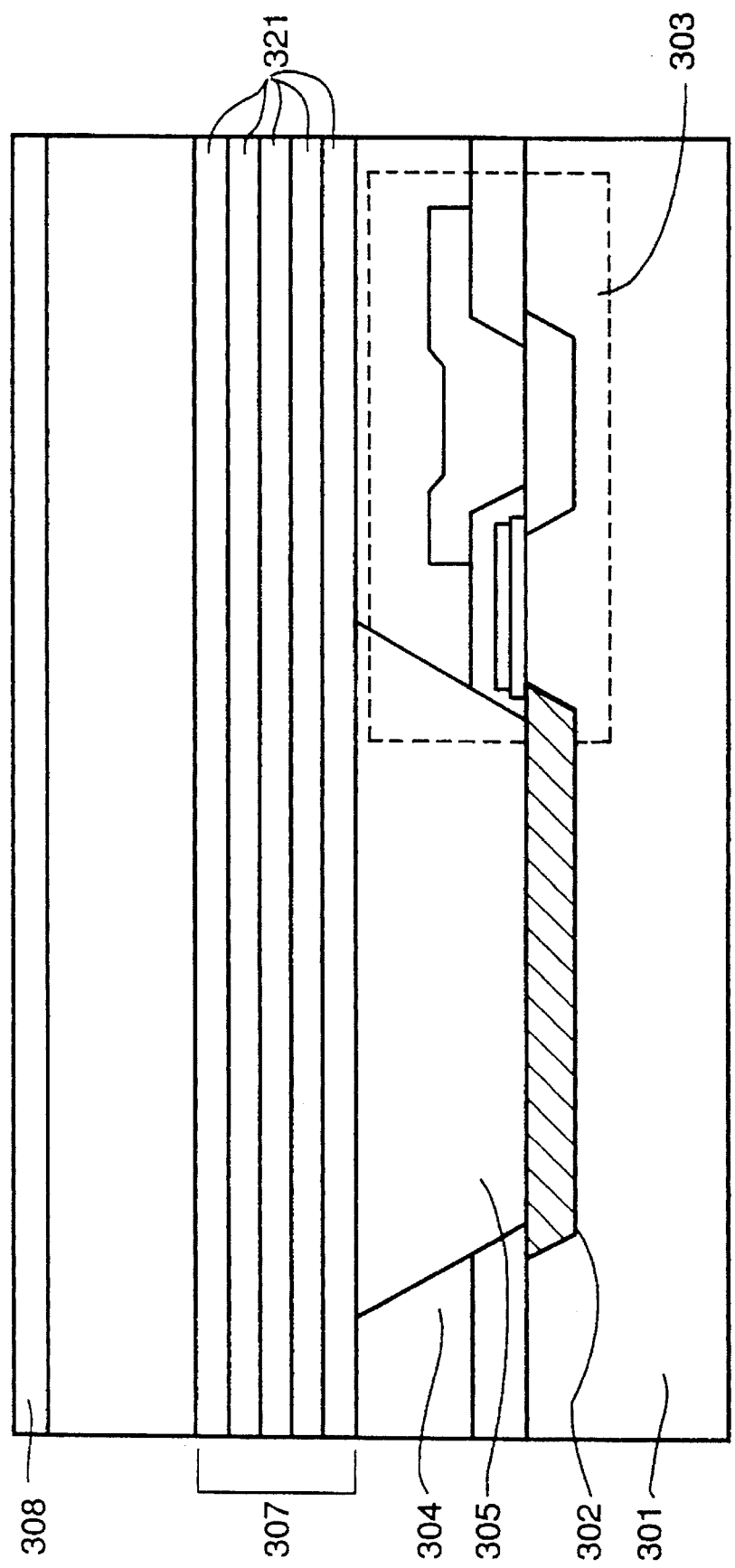

LAMINATED SOLID-STATE IMAGE SENSING APPARATUS AND METHOD OF MANUFACTURING THE SAME

This application is a continuation of application Ser. No. 07/973,953 filed Nov. 9, 1992, now abandoned.

BACKGROUND OF THE INVENTION

1. Field of the Invention

The present invention relates to a solid-state image sensing apparatus for use in an input portion of an information processing apparatus such as a facsimile machine, a video camera, a copying machine and the like. More particularly, the present invention relates to a solid-state image sensing apparatus formed by stacking a photosensitive layer on a single crystal semiconductor circuit substrate having a signal charge storage portion, a signal reading circuit, a scanning circuit, a drive circuit and the like, and a method of manufacturing the same.

2. Related Background Art

Recently, solid-image sensing apparatuses utilizing semiconductors have been widely used and there arises a desire of solid-state image sensing device which has further improved performance and the cost of which can be further reduced.

Hitherto, the main portion of solid-state image sensing devices has been mainly constituted, similarly to CCDs and MOS solid-state image sensing apparatuses for example, in such a manner that a light receiving device portion, a signal charge storage portion, a signal reading circuit, a scanning circuit, a signal processing circuit, and the like are formed on the same semiconductor substrate. Furthermore, laminated solid-state image sensing apparatuses, in which a photo-conductive film serving as a light receiving device is stacked on a semiconductor substrate, have been disclosed.

In order to describe the conventional technology, an example of an MOS solid-state image sensing apparatus will now be described with reference to FIG. 1.

Referring to FIG. 1, reference numeral 101 represents a p⁻type silicon substrate, 102 represents a $p^+$ region, 103 represents a $p^-$ region, 104 represents a $n^+$ source region, 105 represent a $n^-$type drain region, 106 represents a gate oxidized film, 107 represents a poly-silicon for a gate electrode, 108 represents a first silicon oxidized film, 109 represents an electrode, and 116 represents a passivation film.

In this case, a light receiving device comprises an $n^+$ $p^-$ $p^+$ diode composed of the $n^+$ source region 104, the $p^-$ region 103 and $p^+$ region 102, and this diode also serves as a signal charge storage portion.

FIG. 2 shows a conventional example of a stacked type solid-state image sensing apparatus in which a photosensitive film is stacked on the aforesaid solid-state image sensing apparatus. Referring to FIG. 2, reference numeral 110 represents a first pixel electrode, 111 represents a second silicon oxidized film, 112 represent a third silicon oxidized film, 113 represents a second pixel electrode, 114 represents a photo-conductive film serving as a photosensitive film, and 115 represents a transparent electrode, and residual elements are the same as those shown in FIG. 3.

However, the aforesaid conventional technologies encountered the following problems to be solved.

In the conventional solid-state image sensing apparatus shown in FIG. 1, the thickness and the density of impurities of the $p^-$region of the $n^+$ $p^-$ $p^+$ diode serving as the light receiving device have been determined in order to obtain desired light absorbing characteristics. However, it is impossible for the $n^+$ $p^-$ $p^+$ diode, the thickness and the density of the impurities of which have been determined to obtain desired light receiving characteristics, to obtain a desired storage capacity because the $n^+$ $p^-$ $p^+$ diode also serves as a signal charge storage capacity. Therefore, there arises a problem in that the charge quantity of a saturation signal is reduced and dynamic range is undesirably lowered. If the $p^+$ region is designed to have a desired storage capacity, desired light receiving characteristics cannot be obtained.

That is, the aforesaid structure encounters a problem that both desired characteristics for the light receiving device and the storage capacity characteristics cannot easily be obtained. This problem experienced with the conventional case in which the light receiving device comprises the $n^+$ $p^-$ $p^+$ diode also arises in the other structure.

In the conventional laminated solid-state image sensing apparatus shown in FIG. 2, the photo-conductive film 114 serves as a light receiving device and the storage capacity can be mainly determined by the junction capacity of the $n^+$ source region 104. Therefore, the problem described with reference to FIG. 1 can be overcome, but the following problem arises.

Since the semiconductor circuit substrate shown in FIG. 2 and having a variety of devices and circuits formed thereon has excessively large projections and pits in its surface on which the photo-conductive film will be formed, problems arise in that dark currents increase in the photo-conductive film and the resolution deteriorates if the photo-conductive film is stacked in this state. Therefore, there is a necessity of flattening the surface on which the photo-conductive film will be formed. Accordingly, the inventors of the present invention employed the following manufacturing process and manufactured the apparatus shown in FIG. 2. The process will now be briefly described with reference to FIGS. 3 to 9.

(1) After devices have been formed on a semiconductor substrate by using a MOS process, the second silicon oxidized film 111 serving as an interlayer insulating film is deposited and a contact hole is formed on a source region (see FIG. 3).

(2) The first pixel electrode 110 is formed (see FIG. 4).

(3) The third silicon oxidized film 112 is deposited and a resist is applied, so that a flat surface is formed (see FIG. 5).

(4) The entire surface is etched while making the same the etching rate for the resist and that for the third silicon oxidized film 112, for example, using a parallel-flat plate type dry etching apparatus. Thus, the flat third silicon oxidized film 112 can be obtained (see FIG. 6).

(5) A contact hole for establishing a contact between the first pixel electrode 110 and the second pixel electrode 113 is formed (see FIG. 7).

(6) The second pixel electrode 113 is formed (see FIG. 8).

(7) The photo-conductive film 114 is stacked (see FIG. 9).

That is, the aforesaid process requires four photomasks after the semiconductor circuit has been formed in each of process (1) for forming the contact hole, (2) for forming the first pixel electrode, (5) for forming the contact hole and (6) for forming the second pixel electrode.

Therefore, the aforesaid conventional laminated-type solid-state image sensing apparatus encounters problems of a complicated manufacturing process, a short circuit between electrodes, and unsatisfactory yield caused from them.

Although the aforesaid descriptions were made about the MOS solid-state image sensing apparatus and the laminated type solid-state image sensing apparatus as the conventional example, any of the solid-state image sensing apparatus encounters the aforesaid problem because the CCD type, SIT type and the bipolar type solid-state image sensing apparatuses have the light receiving portion and the signal charge storage portion which structured basically similarly to the aforesaid apparatuses.

SUMMARY OF THE INVENTION

An object of the present invention is to provide a solid-state image sensing apparatus, which can be manufactured by a simple process and which reveals an excellent yield, and a method of manufacturing the same.

Another object of the present invention is to provide a solid-state image sensing apparatus in which a signal having a large SN ratio by preventing a dark current and which is capable of picking up an image while maintaining high resolution.

An object of the present invention can be achieved by a solid-state image sensing apparatus comprising: a substrate having a charge storage portion capable of storing charges and an output circuit for outputting a signal in accordance with the charges stored in the storage portion; an insulating film formed on the surface of the substrate and having an opening formed above the charge storage portion; and a photosensitive layer formed on the insulating film and electrically connected to the charge storage portion via the opening, wherein an embedded region is formed within the opening and the surface of the insulating film and that of the embedded region are substantially flattened.

An object of the present invention can be achieved by a method of manufacturing a solid-state image sensing apparatus having: a substrate having a charge storage portion capable of storing charges and an output circuit for outputting a signal in accordance with the charges stored in the storage portion; an insulating film formed on the surface of the substrate and having an opening formed above the charge storage portion; and a photosensitive layer formed on the insulating film and electrically connected to the charge storage portion via the opening, the method of manufacturing a solid-state image sensing apparatus comprising the steps of: forming the insulating film on the substrate; forming an embedded region within the opening; flattening the surface of the embedded region and that of the insulating film; and forming the photosensitive layer on the insulating film.

BRIEF DESCRIPTION OF THE DRAWINGS

FIGS. 21A to 21F are schematic cross sectional views which illustrate a process of manufacturing a solid-state image sensing apparatus commonly adapted to Embodiments 7 and 8 of the present invention;

FIG. 22 is a schematic cross sectional view which illustrates a solid-state image sensing apparatus according to Embodiment 9 of the present invention;

DETAILED DESCRIPTION OF THE PREFERRED EMBODIMENTS

Preferred embodiments of the present invention will now be described.

Figure 10:
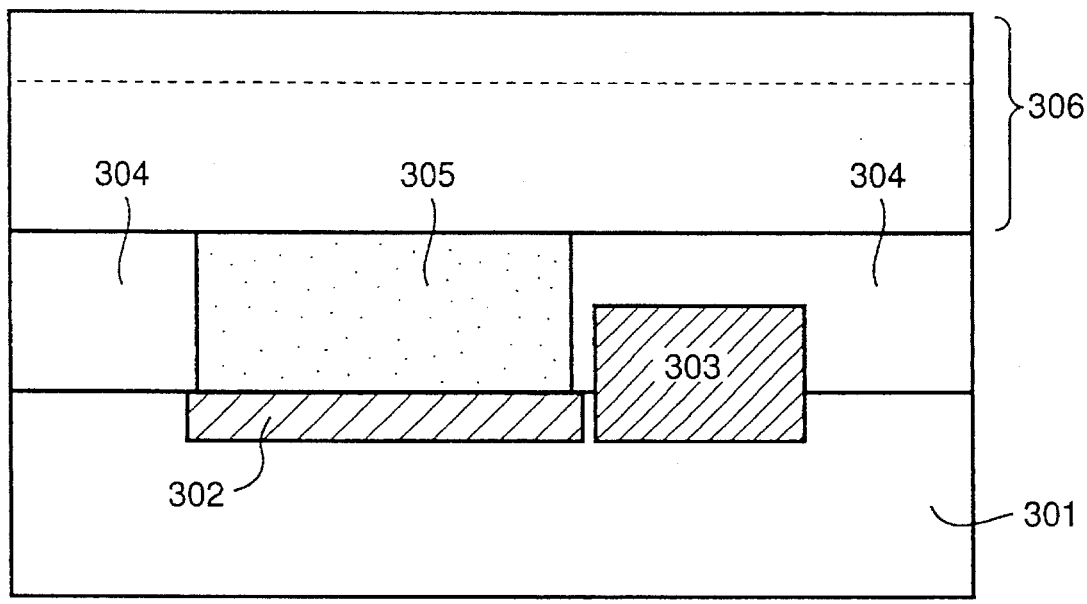
FIG. 10 is a schematic view which illustrates a concept of the present invention.

FIG. 10 is a schematic view which illustrates the concept of the present invention, elements of which will be described later.

Reference numeral 301 represents a substrate having a signal charge storage portion 302 and a signal reading circuit portion 303 formed on the surface thereof.

Reference numeral 304 represents an insulating film which covers the surface of the substrate 301, the insulating film 304 having a contact hole having an embedded layer 305 therein at a position at which the signal charge storage portion 302 is formed.

It can be understood that the surface of the insulating film 304 and that of the embedded layer are aligned in the horizontal direction and they are flattened.

Hence, also a photosensitive film 306 formed on them is made to be a flat film.

Figure 1:
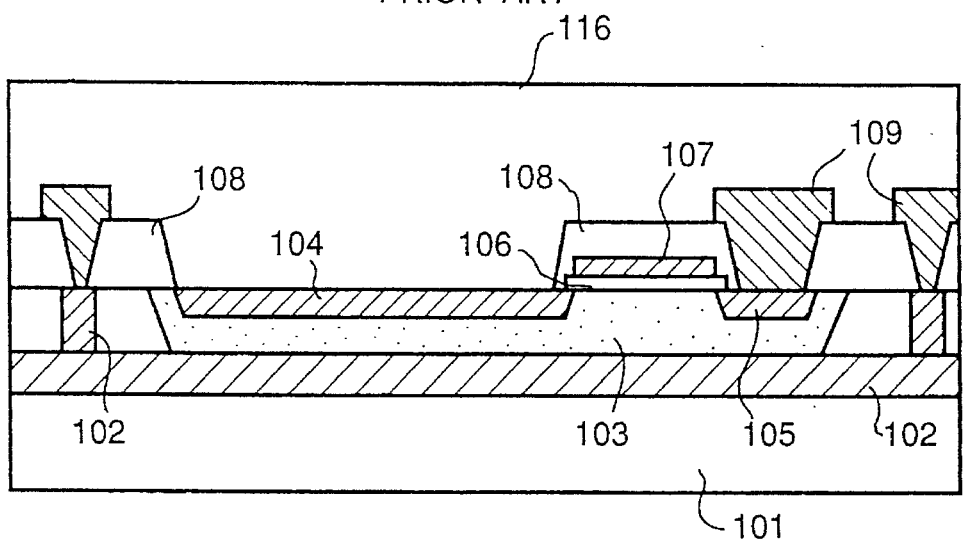
FIG. 1 is a schematic cross sectional view which illustrates an example of a conventional solid-state image sensing apparatus.
Figure 2:
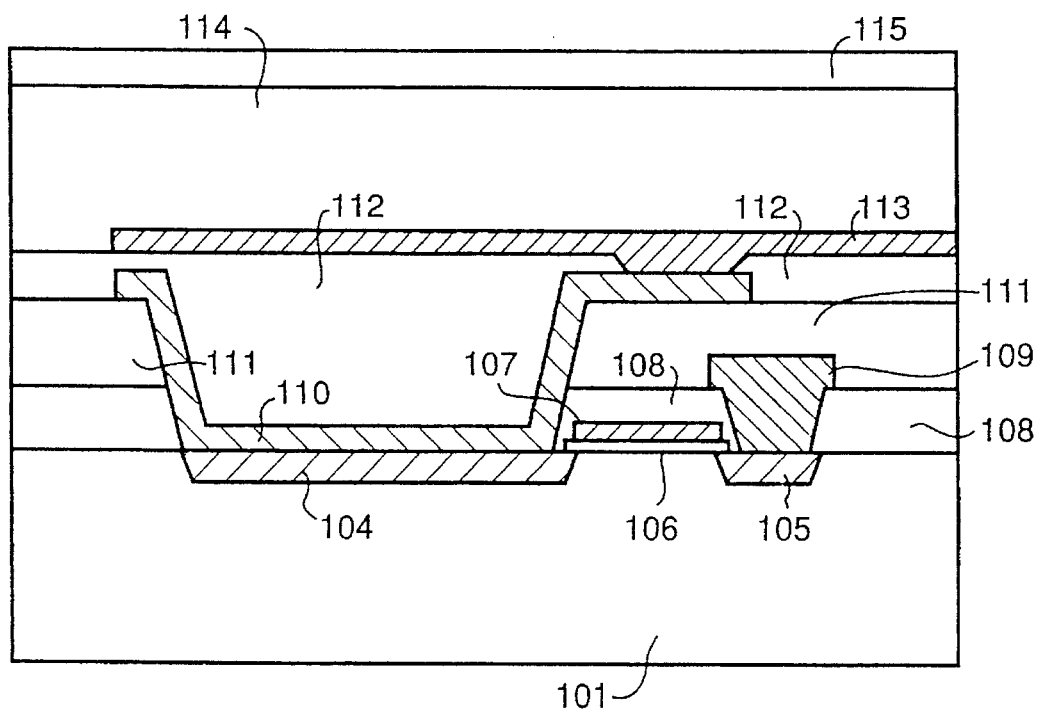
FIG. 2 is a schematic cross sectional view which illustrates another example of a conventional solid-state image sensing apparatus.
Figure 3:
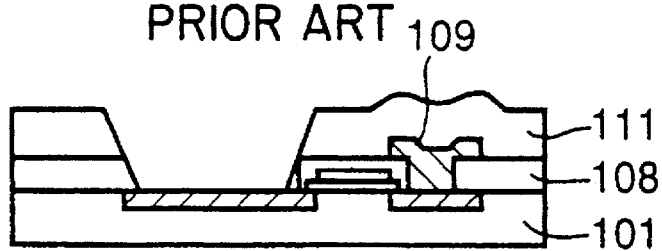
FIGS. 3 to 9 are schematic cross sectional views which illustrate a process of manufacturing the apparatus shown in FIG. 2.
Figure 4:
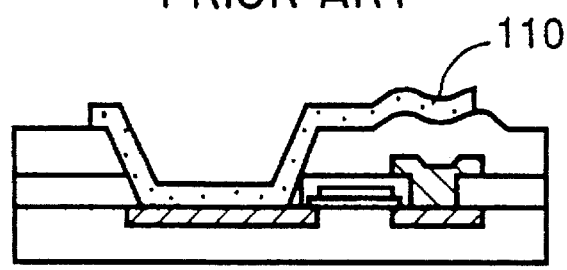

What is evident on comparing the solid-state image sensing apparatus according to the present invention and the conventional solid-state image sensing apparatus shown in FIG. 1 is that the structure of the solid-state image sensing apparatus according to the present invention, in which the photosensitive film 306 is stacked, enables the storage capacity portion 302 to be independently designed and optimized, causing the dynamic range to be improved.

The structure of the solid-state image sensing apparatus according to the present invention and having the second conductive-type embedded layer and the photosensitive film formed on the embedded layer causes the pixel electrode, which must be formed by patterning in the conventional laminated-type solid-state image sensing apparatus, to be eliminated. Therefore, the manufacturing process can be simplified, and specifically, the patterning process can be simplified.

[Photosensitive Film]

The photosensitive film for use in the present invention must receive light to be detected and generate a carrier (electron-hole pair), and therefore it may be a photo-conductive type film or a photovolatic type film. The photosensitive film formed into a single layer structure or a plural-layer structure may have characteristics including the band gap and the conductance which are continuously changed.

Specifically, the materials which can be used to form the photosensitive film are exemplified by: a chalcogenide non-single crystal semiconductor mainly composed of Se or S of ZnSe, ZnCdTe, SeTe, or SeTeAs, or the like and contains, if necessary, at least any one of Te, As or Cd; or a non-single crystal semiconductor mainly composed of Si and contains, if necessary, at least any one of H, F, Cl, O, N, Sn, C, Ge, P, As, B, Al or Ga; or a non-single crystal semiconductor mainly composed of Ge or C and selectively containing the aforesaid atoms.

Specifically, poly-crystal Si, micro-crystal Si, amorphous Si, amorphous SiGe, amorphous SiC and amorphous SiGeC are exemplified. It is preferable to employ: a single body of hydrogenated or fluorinated Si, or SiGe, or SiC; or a material having any one of them which are doped to form a P or N type layer.

The layer structure can be any one of a Schottky barrier type photodiode, a PN junction photodiode, PIN junction photodiode, a photo-conductive device having a Schottky junction on either side thereof and having an ohmic contact on the other side thereof, a photo-conductive device having a PN junction on either side thereof and having an ohmic contact on the other side thereof, a photodiode having a hetero junction, or a photo-conductive device having a hetero junction on either side thereof and having an ohmic contact on the other side thereof.

Specifically, the structure may be any one of a structure having a P-type micro crystal SiC and non-dope amorphous Si, a structure having a P-type amorphous Si and non-dope amorphous $Si_xGe_yC_z$ (where x+y+z= 1, the structure having an $Si_xC_z$ region, an $Si_x$ region and an $Si_xGe_y$ region and a band gap which is continuously changed), and a structure having p-type amorphous Si, non-dope amorphous Si, non-dope amorphous SiGe and a hetero junction.

The term "micro-crystal" used herein is a structure in which micro crystal particles having particle sizes distributed from tens to hundreds of Å which are mixed in amorphous portion. The particle size of the crystal particles can be obtained by an X-ray diffraction method or a Raman spectroscopic method.

The photosensitive layer may comprise an avalanche photodiode (APD) in order to obtain signals having a large SN ratio.

Figure 11:
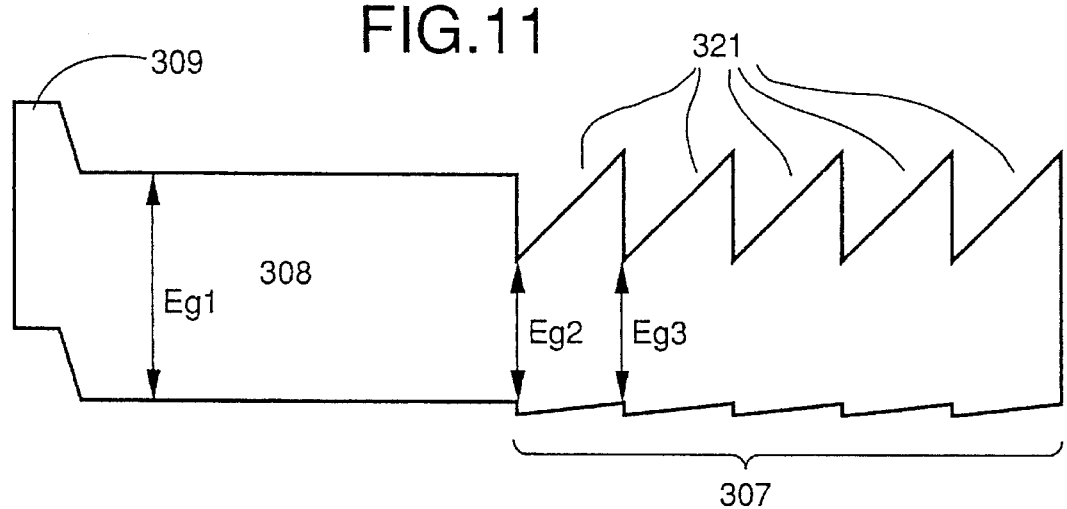
FIGS. 11 and 12 are schematic views which illustrate an energy band profile of a photosensitive film adapted to the present invention, in which FIG. 11 corresponds to a non-bias state and FIG. 12 corresponds to an inverse bias state.

FIG. 11 illustrates the band of such APD in a non-bias state.

Figure 12:
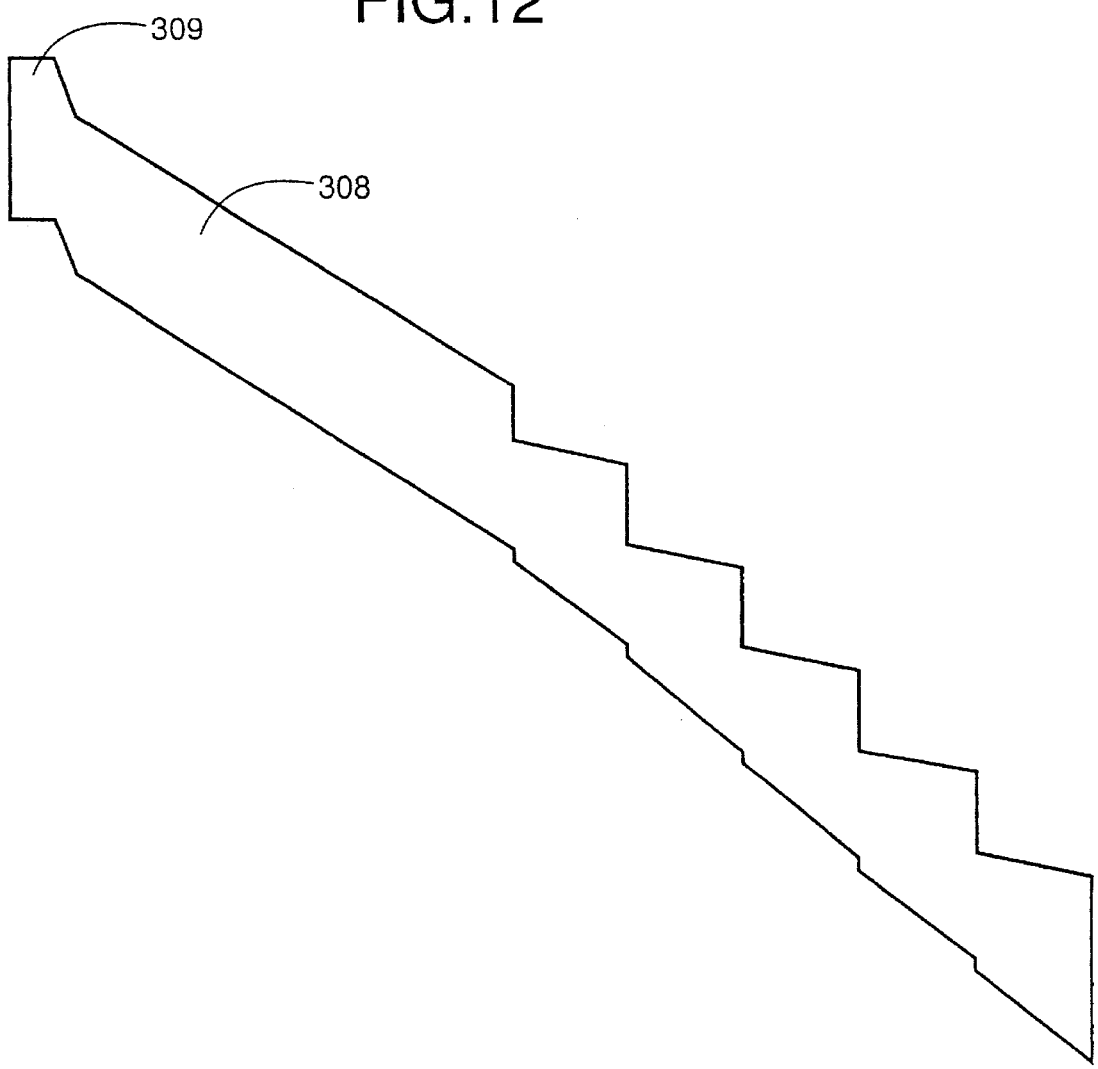

FIG. 12 illustrates the band of the APD which is being activated to which an inverse bias is applied.

Such APD has been disclosed in detail in U.S. Pat. No. 667,400 filed on Apr. 3, 1991 titled as "PHOTOELECTRIC CONVERSION APPARATUS".

The operation of the APD will now be described. Light which has been made incident from the portion adjacent to the charge-injection inhibition layer 309 is absorbed by a light absorbing layer 308 so as to be photoelectrically converted. Electrons of generated electron-hole pair take place ionization due to the energy step of each step back structure and generates new electron-hole pair, causing a multiplying effect to take place. Since each of the step back structure layers, of course, performs a similar operation, the multiplication takes place $2^n$ times, assuming that the number of the layers is n.

It is preferable that the light absorbing layer and the multiplying layer be made of a non single-crystal semiconductor material because it can be formed at low temperatures and it can advantageously be stacked on the semiconductor circuit substrate. Specifically, adaptable materials are exemplified by amorphous silicon compensated by hydrogen and/or halogen element, amorphous silicon germanium, amorphous silicon carbide, or polycrystalline silicon. Since the material for forming the devices is non-single crystal semiconductor material as described above, the devices can be formed by a plasma CVD method at a low temperature (for example, 200° to 300° C.). Furthermore, the inhibition band width can easily be performed because the modulation of the composition can easily be conducted. Hence, the multiplying layer having the step back structure can be easily formed and dispersion of atoms due to heat or the like can be prevented. Therefore, it is advantageous to stack a plurality of layers because the step back structure can be constituted relatively assuredly.

Although the band gap Fg1 of the light absorbing layer 308, the minimum band gap Eg2 of the multiplying layer 307 and the maximum band gap Eg3 of the multiplying layer 307 hold a relationship Eg2<Eg1< Eg2, it is necessary that the difference (energy difference) between Eg3 and Eg2 have a value which is sufficiently large to multiply either of the carriers. The value of Eg1 is arbitrarily determined depending upon light to be detected.

[Embedded Layer]

In the embodiment of the present invention, the characterized embedded layer is made of a semiconductor or a conductive material. It is preferable to employ a micro-crystal material, a poly-crystal material, or a single crystal material having dopant therein for the purpose of controlling the conductive type. Specifically, a semiconductor having any one of the aforesaid crystal structures such as Si, Ge, SiGe, SiC, or SiGeC is employed.

The embedded layer may be made of metal composed of at least one of Al, Ti, Cr, Ni, Mo, Cu, Pd, Pt, Au, Ir, Ag, In, Ta, or their alloy.

When a semiconductor is used in the embedded layer, it is preferable to use a non-dope or a intrinsic semiconductor in the photosensitive layer and to use a P or N-type embedded layer. In the case where the embedded layer is made of metal, it is preferable that the material be selected so that a Schottky junction is formed with the photosensitive layer formed on the embedded layer. In this case, a charge injection inhibition layer may be interposed between the photosensitive layer and the embedded layer.

[Substrate]

The substrate is ordinarily a silicon single crystal substrate having a charge storage portion, and a signal output circuit and the like formed thereon comprises a known devices, that is, a MOS transistor, a bipolar transistor, an SIT, a CCD or the like.

In order to be adapted to an excellent performance and large area apparatus, a substrate may be employed in which a thin film transistor may be formed on an insulating substrate.

Such output circuit has been disclosed in the specification of U.S. Pat. No. 4,791,469 granted to inventors Omi and Tanaka and that of U.S. Pat. No. 5,084,474 granted to inventors Miyawaki.

[Insulating Layer]

It is preferable that the insulating layer be made of a material capable of realizing a flattened surface which covers projections and pits formed in the substrate.

Specifically, silicon oxide, silicon nitride or an oxidized silicon nitride is employed, and, if necessary PSG, BSG or BPSG which has doped boron (B) and/or phosphorus (P) therein is used.

[Method of Forming Photosensitive Layer]

The photosensitive layer is formed by a known CVD method, a sputtering method, an ion plating method, or an electron beam evaporation method, or the like.

In particular, it is preferable to employ any one of the plasma CVD method, photo-CVD method, a reactive sputtering method, or a bias sputtering method.

[Method of Forming Insulating Layer]

It is preferable to form the insulating layer by a CVD method or a sputtering method. In particular, it is preferable that the insulating layer be obtained by forming PSG, BSG or BPSG and it is reflowed or be obtained by a plasma CVD method in which TEOS (tetraethylorthosilicate) is used.

[Method of Forming Embedded Layer]

A typical method of forming the embedded layer is an etch back method or a selective deposition method.

Specifically, polycrystal silicon is deposited thick on the insulating film having the contact hole, and then a resist material having substantially the same etching rate as that of the polycrystal silicon is selected so as to be coated on the polycrystal Si before it is flattened. Then, the entire surface is etched so as to cause the base insulating film to appear outside. Thus, a flat surface in which the surface of the embedded layer and that of the insulating film are aligned can be obtained.

The selective deposition method uses a film forming method in which no deposition takes place on the insulating film and the deposition takes place in only the contact hole so as to form the embedded layer in the contact hole. In the case where the metal is employed, it is preferable to employ a selective deposition method in which $WF_6$ is used or a selective deposition method in which Al $(CH_3)_2H$ and $H_2$ are used. In the case where the semiconductor is used, it is preferable to employ a selective epitaxial growth method.

A lift-off method can be employed. The aforesaid methods will be described in the following embodiments.

The solid-state image sensing apparatus will now be described with reference to embodiments, but the present invention is not limited to the descriptions about the embodiments.

(Embodiment 1)

Figure 13:
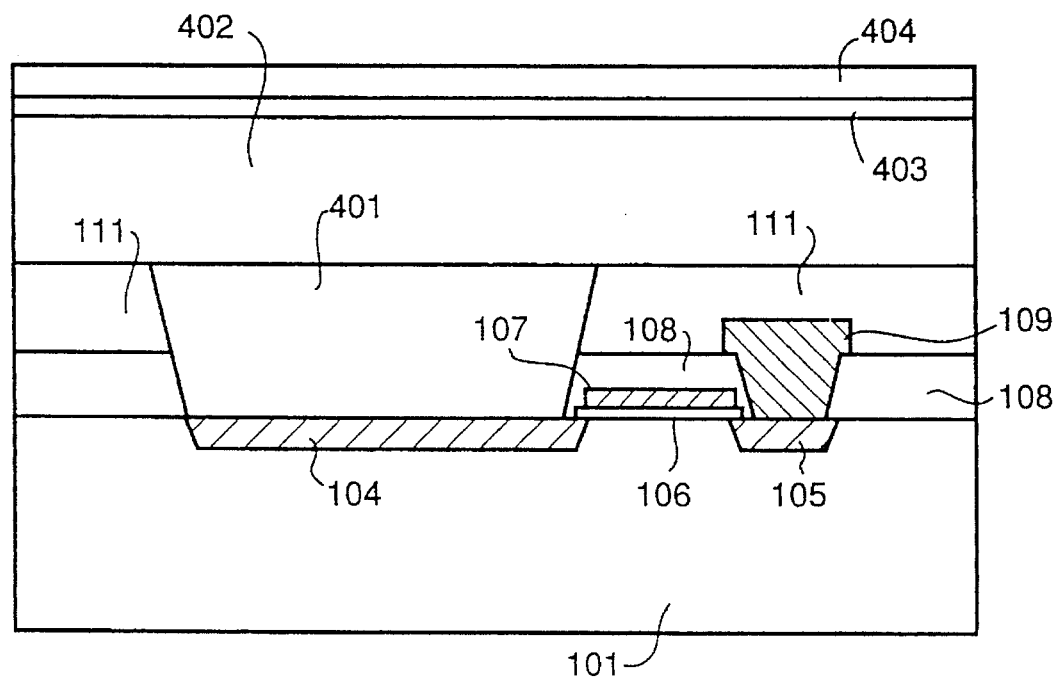
FIG. 13 is a schematic cross sectional view which illustrates a solid-state image sensing apparatus according to Embodiment 1 of the present invention.

FIG. 13 is a cross sectional view which illustrates an embodiment of a solid-state image sensing apparatus according to the present invention. In this embodiment, a laminated type solid-state image sensing apparatus is constituted by staking a photo-conductive film on a semiconductor circuit substrate on which an nMOS device is formed. It will now be described in the sequential order of the manufacturing process.

Either the p or n-type semiconductor is called a first conductive type semiconductor, while the residual one is called a second conductive type semiconductor. In this embodiment, a p-type semiconductor is used as the first conductive type semiconductor and a n-type semiconductor is used as the second conductive type semiconductor.

First, an oxide/nitride film is formed on a p-type single crystal silicon substrate 101, and then patterning is performed. By using it as a mask, a channel stopper and a field oxide film are formed, the oxide/nitride film in an active region is removed, a gate oxide film 106 is formed by a heat oxidation method, and then channel doping is performed by employing an ion injection method.

Then, a polysilicon film is deposited by a CVD method and P is dispersed in order to reduce the resistance, and patterning is performed, so that a polysilicon gate electrode 107 is formed.

Then, As is injected by using an ion injection method, so that a source region 104 and a drain region 105 are formed. At this time, the polysilicon gate electrode 107 serves as a mask, so that the overlap of the gate, the source and the drain is reduced considerably.

Then, a first silicon oxide film 108 is deposited as an interlayer insulating film by using a CVD method, and patterning is performed, so that a contact hole is formed, and then a wiring electrode 109 is formed.

Then, a second silicon oxide film 111 is deposited as an interlayer insulating film, and a resist is applied, so that a flat surface is formed. Then, etching is performed by using RIE under a condition that the etching rate of the resist and that of the silicon oxide film are made to be the same, so that the silicon oxide film is flattened. This flattening process is the same as the process shown in FIGS. 5 and 6.

Figure 5:
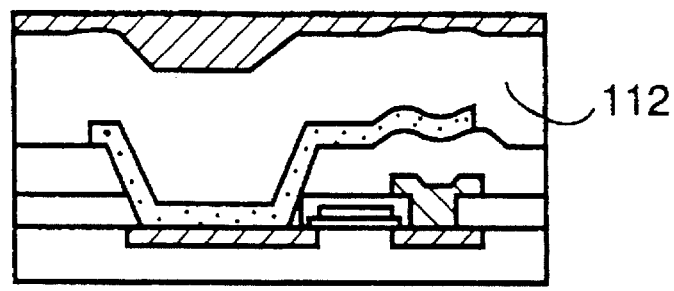
Figure 6:
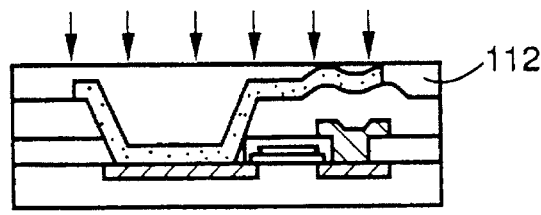
Figure 7:
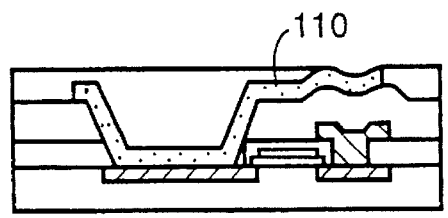
Figure 8:
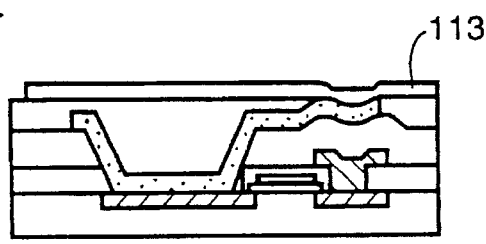
Figure 9:
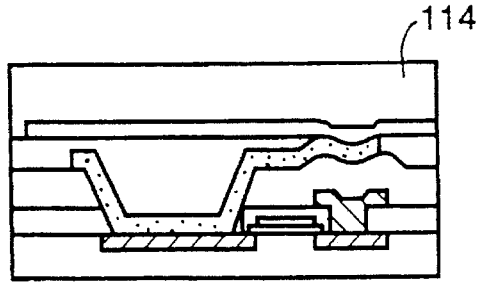

Then, the silicon oxide film on the source region is etched, so that a contact hole is formed, and then an embedded layer 401 is formed. The embedded layer 401 is formed in such a manner that n-type micro-crystal silicon 401 having a small resistance is deposited by using a plasma CVD method. In the aforesaid deposition condition, micro-silicon is enlarged on the single crystal source region, while amorphous silicon is enlarged on the silicon oxide film. After the top surface of the embedded layer 401 has reached a height higher than the surface of the insulating layer 111, the etch back process shown in FIGS. 5 and 6 is performed so as to etch amorphous silicon on the silicon oxide film. In this state, the contact hole formed on the silicon oxide film is plugged with micro-crystal silicon and the entire surface is flattened.

Then, amorphous silicon 402 and p-type amorphous silicon 403 having doped B are, as photo-conductive films, are continuously deposited by a plasma CVD method, and an ITO 404 to serve as a transparent electrode is finally formed by a sputtering method, so that a solid-state image sensing apparatus shown in FIG. 10 is manufactured.

In the solid-state image sensing apparatus thus manufactured, a pin structure is formed composed of a p-type amorphous silicon 403/an i-type amorphous silicon 402/an n-type microcrystal silicon 401.

When the solid-state image sensing apparatus according to this embodiment is manufactured, patterning is required in only the process of forming the contact hole in the silicon oxide film after the semiconductor circuit substrate has been formed. Furthermore, a third silicon oxide film required in the conventional laminated type solid-state image sensing apparatus can be omitted from the solid-state image sensing apparatus according to the present invention. Therefore, the manufacturing process can significantly be reduced.

Although the nMOS semiconductor circuit substrate is formed in the aforesaid embodiment, the solid-state image sensing apparatus according to the present invention is not limited to the MOS semiconductor circuit substrate. For example, a semiconductor circuit substrate having a CCD, SIT, and/or bipolar devices formed thereon may be used.

(Embodiment 2)

Then, a second embodiment of the present invention will now be described in which a photo-conductive film is stacked on a bipolar solid-state image sensing apparatus.

Figure 14:
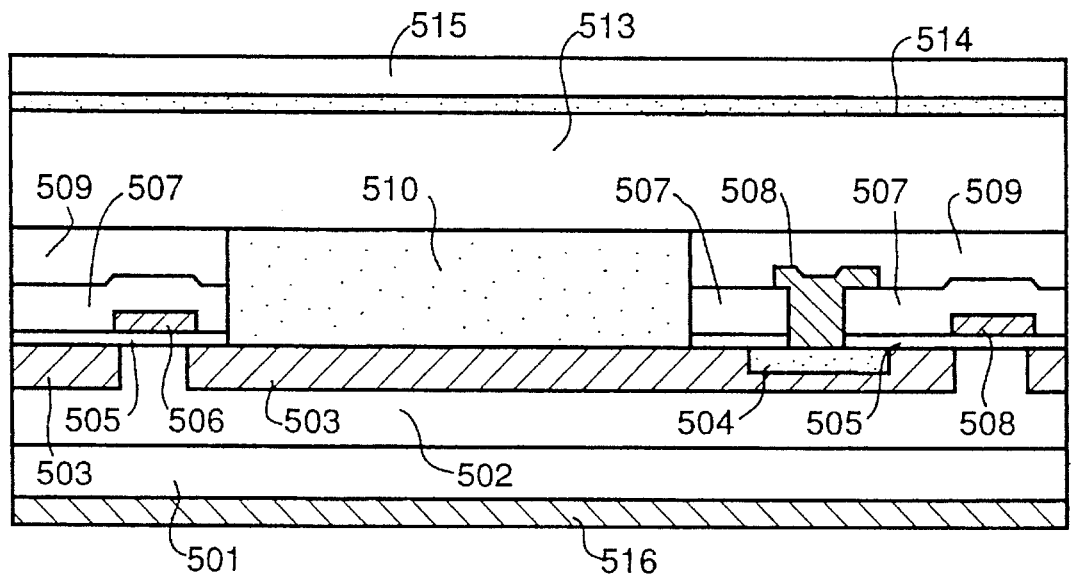
FIG. 14 is a schematic cross sectional view which illustrates a solid-state image sensing apparatus according to Embodiment 2 of the present invention.
Figure 15:
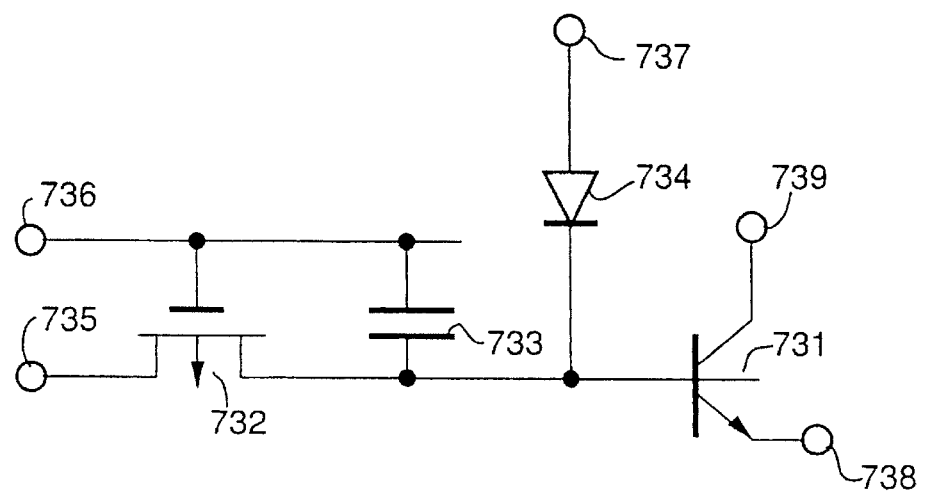
FIG. 15 is an equivalent circuit diagram to a unit cell of the solid solid-state image sensing apparatus according to any one of Embodiments 2, 4, 8 or 10 of the present invention.
Figure 16A:
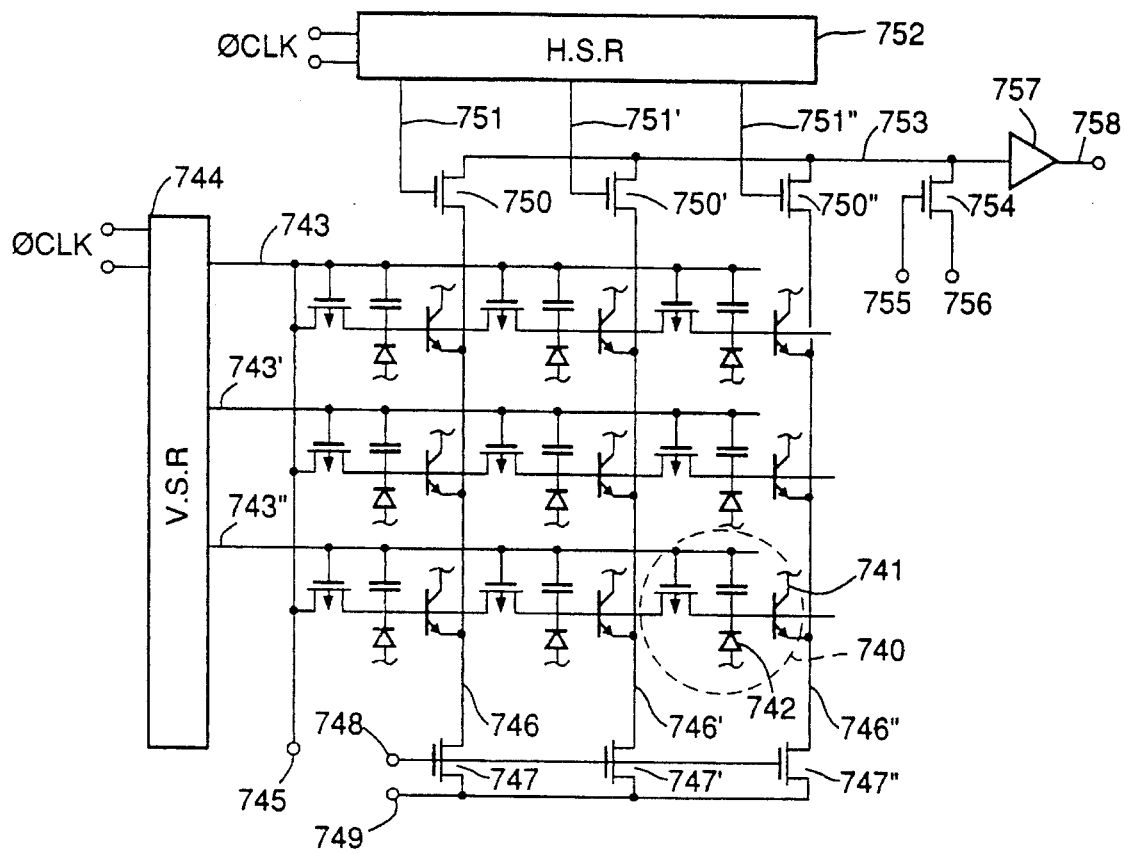
FIG. 16 is circuit diagram which illustrates the solid-state image sensing apparatus according to any one of Embodiments 2, 4, 8 or 10 of the present invention.
Figure 16B:
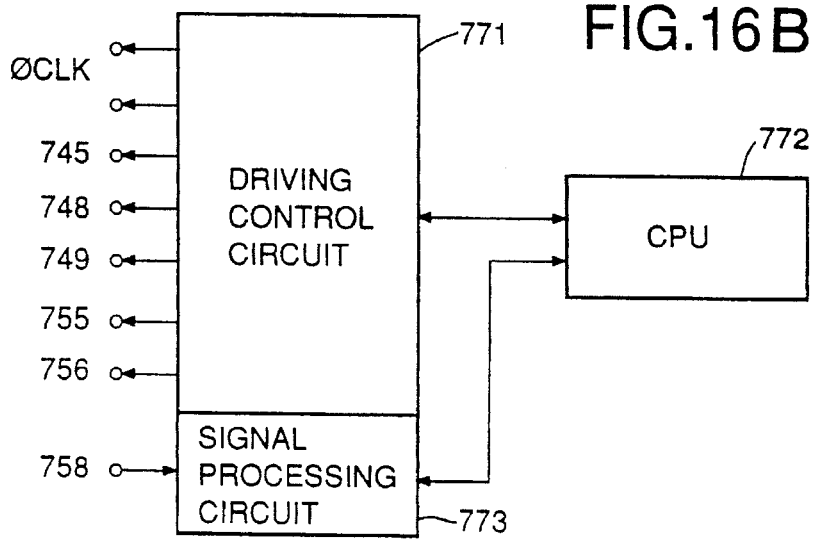

FIG. 14 is a schematic cross sectional view which illustrates a portion including a light receiving portion according to this embodiment of the present invention. FIG. 15 illustrates a circuit diagram equivalent to one pixel. FIG. 16 is a circuit diagram which is equivalent to the overall body of the apparatus according to the present invention and also is an equivalent circuit block diagram.

Referring to FIG. 14, an n⁻ layer 502 which is made to be a collector region due to epitaxial growth is formed on an n-type silicon substrate 501, and a p-base region 503 and an n⁺ emitter region 504 are formed in the n⁻ layer 502, so that a bipolar transistor is formed.

The p-base region 503 is separated from adjacent pixels, and each gate electrodes 506 is formed between adjacent p-base regions 503 when viewed in the horizontal direction while interposing an oxide film 505. Therefore, a p-channel MOS transistor, in which the adjacent p-base regions 503 are made to be source and drain regions, is constituted. Gate electrodes 506 also serve as capacitors for controlling the electric potential of the p-base regions 503.

After an insulating layer 507 has been formed, an emitter electrode 508 is formed. Then, an insulating layer 509 is formed and flattening is performed before the insulating layers 507, 509 and the oxide film 505 are etched so that a contact hole is formed in the base region 503, so that a p-type polycrystal silicon 510 for use to plug the contact hole is formed.

Then, an RF plasma CVD method is employed to continuously form an i-type amorphous silicon 513 and an n-type amorphous silicon 514 as photo-conductive film, so that an ITO of a transparent electrode 515 is formed. Furthermore, a collector electrode 516 is ohmic-connected to the reverse side of the substrate 501.

Therefore, an equivalent circuit to one pixel is, as shown in FIG. 15 expressed by a base of a bipolar transistor 731 to which a p-channel MOS transistor 732, a capacitor 733 and a photoelectric conversion device 734 are connected, a terminal 735 for applying an electric potential to the base, a p-channel MOS transistor 732, a terminal for activating a capacitor 733, a sensor electrode 737, an emitter electrode 738 and a collector electrode 739.

FIG. 16 is a circuit diagram in which pixels 740 shown in FIGS. 14 and 15 are arranged in a two-dimensional 3×3 matrix.

In FIG. 16, a collector electrode 741 of the pixel 740 is disposed in each pixel, and also a sensor electrode 742 is disposed in each pixel. A gate electrode and a capacitor electrode of the PMOS transistor are respectively connected to drive lines 743, 743' and 743" which correspond to the lines, so that they are connected to a vertical shift register (V.S.R) 744.

The emitter electrode is connected to each of signal reading vertical lines 746, 746' and 746" for each column. The vertical lines 746, 746' and 746" are respectively connected to switches 747, 747' and 747" for resetting the charge of the vertical lines and reading switches 750, 750' and 750". Gate electrodes of the reset switches 747, 747' and 747" are commonly connected to a terminal 748 for applying vertical reset pulses, while the source electrode is connected to a terminal 749 for applying vertical line reset voltage. Gate electrodes of the reading switches 750, 750' and 750" are respectively connected to a horizontal shift register (H.S.R) 752 via lines 751, 751' and 751", while drain electrodes are connected to an output amplifier 757 via a horizontal reading line 753. The horizontal reading line 753 is connected to a switch 754 for resetting the charge of a horizontal reading line.

The reset switch 754 is connected to a terminal for applying horizontal line reset pulses and to a terminal 756 for applying horizontal line reset voltage. An output from the output amplifier 757 is received via a terminal 758.

The operation of this embodiment will now be described briefly with reference to FIGS. 14, 15 and 16.

Light made incident on the apparatus according to this embodiment is absorbed by a light absorbing layer 513 shown in FIG. 14, and a generated carrier is stored in the base region 503.

When drive pulses outputted from the vertical shift register shown in FIG. 16 appear in the drive line 743, the base potential is raised via the capacitor, causing a signal change corresponding to the light quantity is received by the vertical lines 746, 746' and 746" from the pixels on the first line.

When scanning pulses are sequentially outputted from the horizontal shift register 752 to the lines 751, 751' and 751", the switches 750, 750' and 750" are sequentially switched on/off, so that a signal is received by the output terminal 758 via the amplifier 757. At this time, the reset switch 754 is switched on during the period in which the switches 750, 750' and 750" are sequentially switched on/off, so that a residual charge in the horizontal line 753 is removed.

Then, the vertical line reset switches 747, 747' and 747" are switched on, so that residual charges in the vertical lines 746, 746' and 746" are removed. When negative-directional pulses are applied to the drive line 743 from the vertical shift register, the PMOS transistor for each pixel on the first line is turned on, so that the base residual charge in each pixel is removed and initialization is performed.

Then, drive pulses outputted from the vertical shift register 744 appear in the drive line 743', so that a pixel signal for the second line is received similarly.

A signal charge of the pixel for the third line is similarly received.

The aforesaid operation is controlled in accordance with commands issued from a drive control circuit 771, which is an individual external circuit, a signal processing circuit 773 and a CPU 772. By repeating the aforesaid operation, the apparatus according to the present invention is operated.

Since the solid-state image sensing apparatus according to embodiments 1 and 2 has a structure in which the photo-sensitive film is stacked, the storage capacity portion can be individually designed on a semiconductor circuit substrate so as to be an optimum storage capacity portion. Therefore, both the characteristics of the light receiving device and the storage capacity characteristics can be improved, and the dynamic range can be improved.

Since the solid-state image sensing apparatus comprises the second conductive type embedded layer formed on the charge storage portion, a true or a substantially true non-single crystal semiconductor layer formed on the embedded layer and the first conductive non-single crystal semiconductor layer formed on the non-single crystal semiconductor layer which form a double-layered photo-conductive film, the pixel electrode used in the conventional laminated type solid-state image sensing apparatus can be omitted from the structure. Therefore, the manufacturing process can be simplified, and, in particular, the patterning process can be simplified. Hence, solid-state image sensing apparatus having excellent performance and revealing reduced cost can be provided while maintaining a satisfactory yield.

(Embodiment 3)

Another embodiment of a solid-state image sensing apparatus according to the present invention will now be described with reference to FIG. 17.

In this embodiment, a laminated solid-state image sensing apparatus, in which a photo-conductive film is stacked on a semiconductor circuit substrate having an nMOS transistor formed thereon, is structured. First, an oxide and a nitride films are formed on a p-type single crystal silicon substrate 101, and then patterning is performed. By using it as a mask, a channel stopper and a field oxide film are formed, the oxide film and a nitride film in an active region are removed, a gate oxide film 106 is formed by a heat oxidation method, and then channel doping is performed by employing an ion injection method. Then, a polysilicon film is deposited by a CVD method and P is dispersed in order to reduce the resistance, and patterning is performed, so that a polysilicon gate electrode 107 is formed. Then, As is injected by using an ion injection method, so that a source region 104 and a drain region 105 are formed. At this time, the polysilicon gate electrode 107 serves as a mask, so that the overlap of the gate, the source and the drain is reduced considerably. Then, a first silicon oxide film 108 is deposited as an interlayer insulating film by using a CVD method, and patterning is performed, so that a contact hole is formed, and then a wiring electrode 109 is formed. Then, a second silicon oxide film 111 is formed as an interlayer insulating film, and a resist is applied, so that a flat surface is formed. Then, etching is performed by using RIE (Reactive Ion Etching) under a condition that the etching rate of the resist and that of the silicon oxide film are made to be the same, so that the silicon oxide film is flattened. This flattening process is the same as the process shown in FIGS. 5 and 6. Then, the silicon oxide film on the source region is etched, so that a contact hole is formed, and then a metal embedded layer 401 is formed. The metal embedded layer uses an aluminum (Al) layer prepared by a selective CVD method. The selective CVD method is performed by using dimethylhydride as a raw material gas and by using hydrogen as a reactive gas and a carrier gas under conditions that the pressure is 2 Torr and the temperature of the substrate is 300° C. After the metal embedded layer has been thickened to a desired thickness, the substrate is placed in a capacity-coupled-type plasma CVD apparatus, so that a multiplying layer 407, a light absorbing layer 408 and a charge injection inhibition layer 409 are formed. The step-back structure layer is formed into a composition-changed layer in which the composition ratio of carbon and silicon or that of germanium and silicon is continuously changed so as to have a continuous inhibition band width from amorphous silicon carbide to amorphous silicon germanium. The composition-changed layer is formed by the following method. As the raw material gas, $SiH_4$, $GeH_4$, $CH_4$ and $H_2$ are used, and the flow rate of each of the raw material gases is controlled by an individual mass-flow controller (hereinafter called an "MFC") before it is supplied to a film forming chamber. The MFC is controlled by a computer so that the gas flow rate is controlled in order to obtain a desired inhibition band width profile. First, deposition is commenced by using $SiH_4$, $CH_4$ and $H_2$ as the raw material gases. Simultaneously with the commencement of the deposition, the flow rate of the $CH_4$ gas is decreased at a predetermined rate. When the flow rate of the $CH_4$ gas is lowered to zero, the $GeH_4$ gas is increased at a predetermined rate. When the composition-changed layer has been thickened to a desired thickness, discharge is stopped. That is, the flow rate of the $GeH_4$ gas and that of the $CH_4$ gas are controlled so as to obtain a desired inhibition width profile with respect to the thickness of a desired composition-changed layer. In this embodiment, the flow rates are controlled so as to make the thickness of one step-back structure layer to be about 200Å, the minimum inhibition band width $Eg2$ to be 1.3 eV and the maximum inhibition band width $Eg3$ to be 2.4 eV. The aforesaid process is repeated, so that five step-back structure layers are formed. Then, $SiH_4$ and $H_2$ gases are selected from the aforesaid raw material gases, so that an amorphous silicon layer 408 having a thickness of 1μ is formed. Then, $B_2H_6$ is added to the raw material gas so that a p-type amorphous silicon layer 409 is formed to have a thickness of 500Å, the p-type amorphous silicon layer 409 serving as a charge injection inhibition layer. After the multiplying layer, the light absorbing layer and the charge injection inhibition layer are continuously formed as described above, an ITO 404 is, as a transparent electrode, formed by a sputtering method. Although the thickness of the step-back structure layer in the aforesaid embodiment is about 200Å, the thickness may be in a range with which the carrier is not again bonded but it is able to run. However, it is preferable that the thickness be reduced because the bias to be applied can be lowered. Although the thickness of the light absorbing layer is made to be about 1μ in this embodiment, it may be determined so as to prevent transmission of incidental light to the multiplying layer after it has passed through the light absorbing layer. The metal embedded layer made of Al may be replaced by another metal.

Although the substrate having the nMOS semiconductor circuit formed thereon is used in the aforesaid embodiment, the laminated-type solid-state image sensing apparatus according to the present invention is not limited to the MOS semiconductor circuit substrate. For example, a semiconductor circuit substrate having devices such as CCD, SIT and/or bipolar may be used.

[Example 4]

Figure 18:
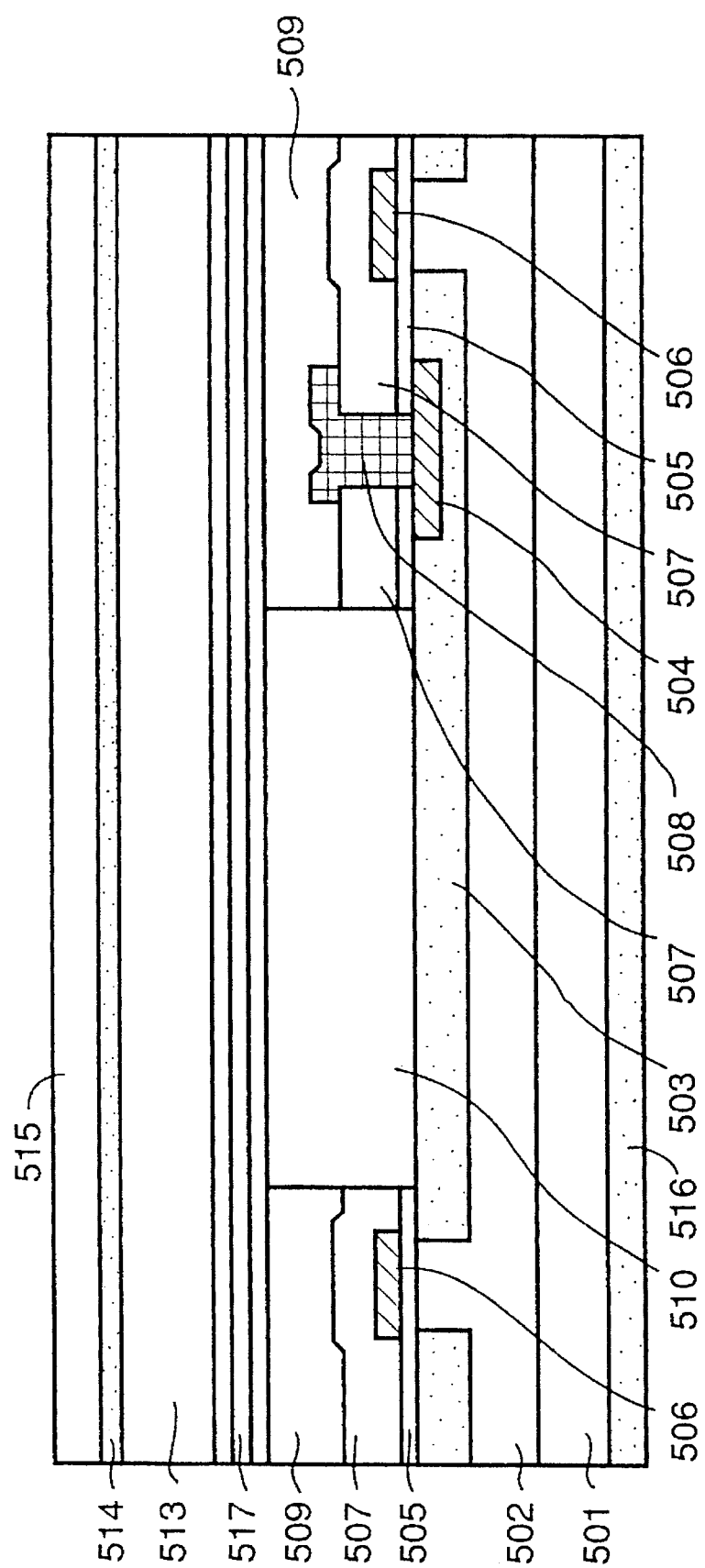
FIG. 18 is a schematic cross sectional view which illustrates a solid-state image sensing apparatus according to Embodiment 4 or 8 of the present invention.

In this embodiment, a substrate having a bipolar transistor as a switch is used and a photo-conductive film is stacked on the substrate. FIG. 18 is a schematic cross sectional view which illustrates a portion including a light receiving portion of this embodiment according to the present invention. An equivalent circuit to one pixel and the circuit structure of the apparatus are the same as those shown in FIGS. 15 and 16. Referring to FIG. 18, an n⁻ layer 502 which is made to be a collector region due to epitaxial growth is formed on an n-type silicon substrate 501, and a p-base region 503 and an n⁺ emitter region 504 are formed in the n⁻ layer 502, so that a bipolar transistor is formed. The p-base region 503 is separated from adjacent pixels, and each gate electrodes 506 is formed between the p-base region 503 and an adjacent p-base region when viewed in the horizontal direction while interposing an oxide film 505. Therefore, a p-channel MOS transistor, in which the adjacent p-base regions 503 are made to be source and drain regions, is constituted. Gate electrodes 506 also serve as capacitors for controlling the electric potential of the p-base regions 503.

After an insulating layer 507 has been formed, an emitter electrodes 508 is formed. Then, an insulating layer 509 is formed and flattening is performed. Then, a control electrode 518 is formed on a pixel-separated region in order to restrict crosstalk. Then, the insulating layer 507 and 509 and the oxide film 505 are etched so that a contact hole is formed in the base region 503. Then, tungsten (W) 510 serving as a metal embedded layer is formed by a selective CVD method in which WF$_6$ is used.

Then, an RF plasma CVD method is employed, so that three layers of composition-changed layers 517 each having a step-back structure serving as the multiplying layer 307, amorphous silicon 513 serving as a light absorbing layer and a p-type amorphous silicon 514 serving as a charge injection inhibition layer are continuously formed. Thus, an ITO of a transparent electrode 515 is formed. In this embodiment, the composition-changed layer is arranged to be changed from amorphous silicon germanium to micro crystal silicon carbide. A control electrode 518 is connected to a transparent electrode 515 so that the carrier leaked onto the pixel separated region disappears and therefore the crosstalk is restricted. A collector electrode 516 is ohmic-connected to the revere side of the substrate 501.

Incidental light is absorbed by the light absorbing layer 513 shown in FIG. 18, and a generated carrier is stored in the base region 503. When high level drive pulses outputted from the vertical shift register shown in FIG. 16 appear on the drive line 743, the base potential is raised via the capacitor, so that signal charges corresponding to the light quantity are, as voltage, read into the capacity of vertical lines 746, 746' and 746" from the pixel on the first line. When high level scanning pulses are sequentially outputted from the horizontal shift register 752 to the lines 751, 751' and 751", the switches 750, 750' and 750" are sequentially switched on/off, so that the voltage of a signal, which has been read into the vertical line, is received by the output terminal 758 via the amplifier 757. At this time, the reset switch 754 is switched on during the period in which the switches 750, 750' and 750" are sequentially switched on/off, so that a residual charge in the horizontal line 753 is removed.

Then, the vertical line reset switches 747, 747' and 747" are switched on, so that residual charges in the vertical lines 746, 746' and 746" are removed. When negative-directional pulses are applied to the drive line 743 from the vertical shift register, the PMOS transistor for each pixel on the first line is turned on, so that the base residual charge in each pixel is removed and initialization is performed.

Then, drive pulses outputted from the vertical shift register 744 appear in the drive line 743', so that a pixel signal for the second line is received similarly.

A signal charge of the pixel for the third line is similarly received.

The aforesaid operation is repeated, so that the apparatus according to this embodiment is operated.

(Embodiment 5)

Figure 19:
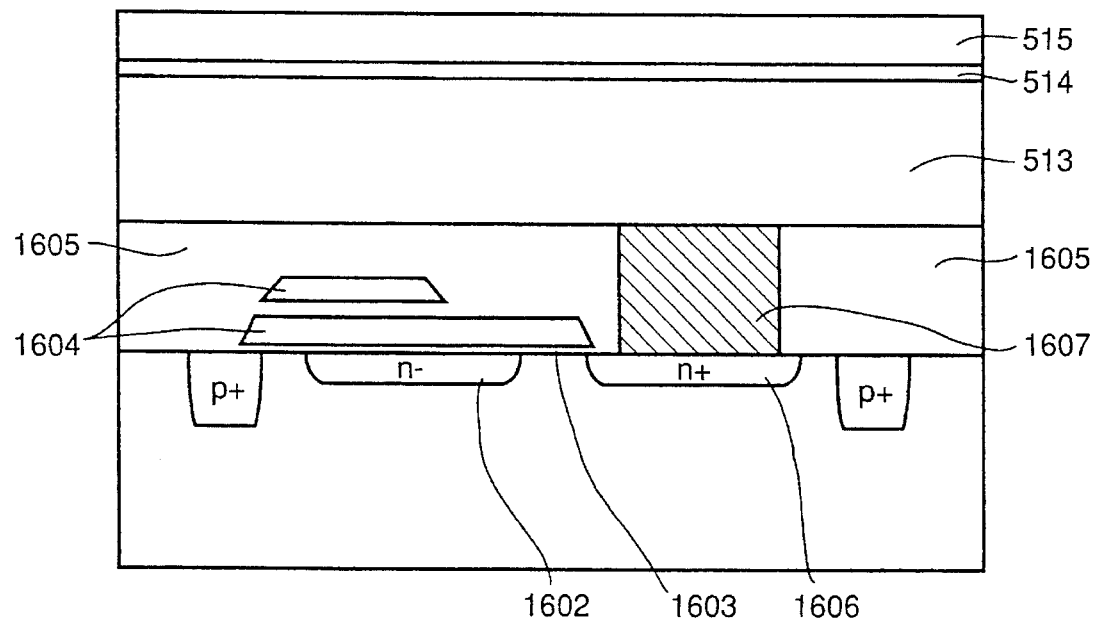
FIG. 19 is a schematic cross sectional view which illustrates a solid-state image sensing apparatus according to Embodiment 5 of the present invention.

In this embodiment, a semiconductor circuit substrate having a CCD register is used and a photo-conductive film is stacked on it. FIG. 19 is a schematic cross sectional view which illustrates a portion including a light receiving portion according to Embodiment 5. Referring to FIG. 19, a channel 1602 of the CCD, a gate insulating film 1603 and a transferring electrode 1604 are formed on a p-type silicon substrate 1601. Then, a thick insulating layer is deposited, and the aforesaid etch back method is employed so as to form a flattened insulating layer 1605. Then, a contact hole is formed in the upper portion of a source region 1601 by an ordinary photolithography method. Then, chrome (Cr) is deposited in the contact hole by a bias sputtering method, so that a metal embedded layer 1607 is formed.

Then, an RF plasma CVD method is employed, so that an i-type amorphous silicon 513 serving as a light absorbing layer, and a p-type amorphous silicon 514 serving as a charge injection inhibition layer are continuously formed. Hence, an ITO of a transparent electrode 515 is formed.

(Embodiment 6)

Figure 20:
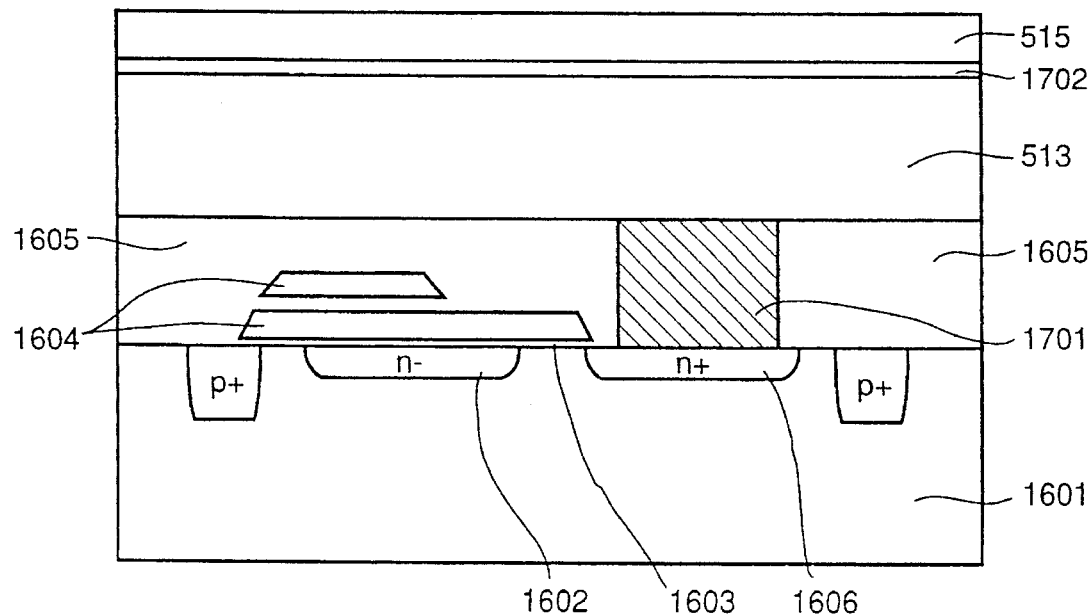
FIG. 20 is a schematic cross sectional view which illustrates a solid-state image sensing apparatus according to Embodiment 6 of the present invention.

In this embodiment, a semiconductor circuit substrate having a CCD register is used and a photo-conductive film is stacked on it. In this embodiment, the metal embedded layer is formed by a lift-off method. FIG. 20 is a schematic cross sectional view which illustrates a portion including a light receiving portion of Embodiment 6.

Referring to FIG. 20, the channel 1602 of a CCD, a gate insulating film 1603 and a transferring electrode 1604 are formed on a p-type silicon substrate. Then, a thick insulating film is deposited, and a known etch back method is employed, so that a flattened insulating layer 1605 is formed. Then, a contact hole is formed above the source region 1606 by an ordinary photolithography method, while using the resist as a mask. Then, the resist used to form the contact hole is not separated (that is, it is left), and platinum (Pt) is deposited on the resist in the contact hole by an electron beam evaporation method. Then, the resist is separated, so that Pt on the resist is removed, and a Pt embedded layer 1701 is formed.

Then, an RF plasma CVD method is employed, so that an i-type amorphous silicon 513 serving as a light absorbing layer, and an n-type amorphous silicon 1702 serving as a charge injection inhibition layer are continuously formed. Hence, an ITO of a transparent electrode 515 is formed.

Then, with reference to FIG. 21, description will now be made about a method of manufacturing a laminated-type solid-state image sensing apparatus which is commonly employed in Embodiments 7 and 8 to be described.

First, an insulating layer (INS) is deposited after a semiconductor circuit substrate (SUB) has been formed (see FIG. 21A). Then, the aforesaid insulating layer is flattened in order to reduce the projections and pits on the surface on which the photo-conductive film will be formed (see FIG. 21B). Then, the insulating layer above the signal charge storage portion is removed (see FIG. 21C). Then, the embedded layer BL is deposited. The deposition of the embedded layer BL is performed by a method which enables polycrystal or single crystal silicon to be enlarged on the single crystal silicon serving as the signal charge storage portion and enables amorphous silicon to be enlarged on the insulating film (see FIG. 21D). The selective crystal deposition of the embedded layer can be performed by using a bias sputter apparatus as disclosed in, for example, Japanese Patent Laid-Open No. 62-287071. Another effective method may be employed in which a deposition precursor is formed by causing a $SiH_4$ gas and a $F_2$ gas to react with each other in a gas phase and the film deposition is performed by transporting the deposition precursor (a chemical deposition method). Furthermore, another method may be employed in which the deposition is performed by plasma-decomposing a $SiF_4$ gas and a $H_2$ gas (an HR-CVD method). With the aforesaid methods, polycrystal or single crystal silicon can enlarged on the single crystal silicon amorphous silicon can be enlarged on the oxide film film by optimizing the film forming parameters such as the flow rate ratio of the raw material gases, the supplied electricity, the pressure, and the temperature of the substrate. Furthermore, doping can be performed by mixing a $PH_3$ or $B_2H_6$ gas with the raw material gas. After the embedded layer has been deposited, the entire surface is etched while using no patterning method such as photolithography. In this case, the amorphous silicon on the insulating film can be selectively removed by employing an etching method which enables the ratio of the etching rate of the amorphous silicon on the insulating film and that of the crystalline silicon in the embedded layer to be enlarged. Thus, the embedded layer and the insulating layer form a flat surface (see FIG. 21E). The etching method may be either ordinary wet etching or dry etching. After the entire surface has been etched, the photo-conductive film (PSL) is deposited (see FIG. 21F). Thus, the laminated-type solid-state image sensing apparatus can be manufactured.

(Embodiment 7)

Figure 17:
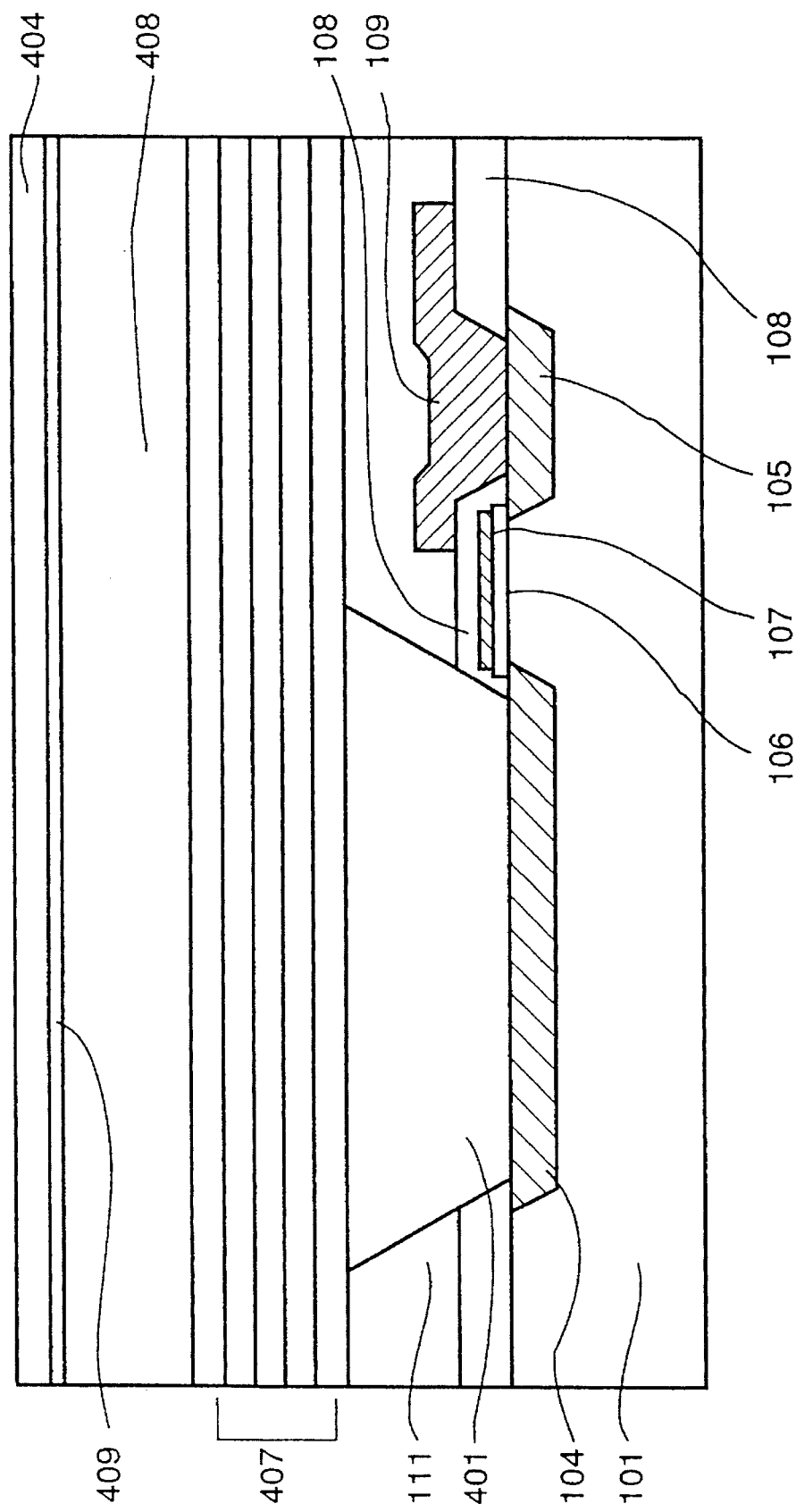
FIG. 17 is a schematic cross sectional view which illustrates a solid-state image sensing apparatus according to Embodiment 3 or 7 of the present invention.

In this embodiment, similar to the embodiment shown in FIG. 17, a laminated-type solid-state image sensing apparatus is constituted by stacking a photo-conductive film on a semiconductor circuit substrate on which an nMOS device is formed. First, an oxide/nitride film is formed on a p-type single crystal silicon substrate 101, and then patterning is performed. By using it as a mask, a channel stopper and a field oxide film are formed, the oxide/nitride film in an active region is removed, a gate oxide film 106 is formed by a heat oxidation method, and then channel doping is performed by employing an ion injection method. Then, a polysilicon film is deposited by a CVD method and P is dispersed in order to reduce the resistance, and patterning is performed, so that a polysilicon gate electrode 107 is formed. Then, As is injected by using an ion injection method, so that a source region 104 and a drain region 105 are formed. At this time, the polysilicon gate electrode 107 serves as a mask, so that the overlap of the gate, the source and the drain is reduced considerably. In this case, a pn diode formed by the source region 104 and the p-type single crystal silicon substrate 101 is made to be a signal charge storage portion. Then, a first silicon oxide film 108 is deposited as an interlayer insulating film by using a CVD method, and patterning is performed, so that a contact hole is formed, and then a wiring electrode 109 is formed. Then, a second silicon oxide film 111 is deposited as an interlayer insulating film, and a resist is applied, so that a flat surface is formed. Then, etching is performed by using RIE under a condition that the etching rate of the resist and that of the silicon oxide film are made to be the same, so that the silicon oxide film is flattened. Then, the silicon oxide film on the source region is etched, so that a contact hole is formed. The contact hole is formed by forming a resist pattern by using an ordinary photolithography method, and then the RIE apparatus is used to perform etching. After the contact hole has been formed, a low resistance and n-type single crystal silicon 401 as the embedded layer is formed by using a bias sputter apparatus by the following process. First, the substrate is injected into a vacuum chamber and the internal pressure is lowered to a vacuum of $1 \times 10^{-8}$ Torr. Then, the substrate is allowed to stand at 400° C. Then, an Ar gas is introduced from a ultra-clean gas supply system into the vacuum chamber, and the pressure is set to 15 mTorr. Then, cleaning is performed for 5 minutes under conditions that the DC voltage of the substrate is + 5 V, the DC voltage of a target is − 5 V and the RF power is 5 W. This cleaning operation removes a natural oxide film present on the surface of the source region 104, so that a clean silicon surface is obtained. Then, silicon is deposited with an RF power of 100 W under set conditions that the pressure is 15 mTorr, the substrate side DC voltage is + 5 V, and the target side DC voltage is –400 V. Under the aforesaid conditions, the deposition speed of the amorphous silicon on the insulating film and that of the embedded layer on the single crystal are substantially the same. When the thickness of the embedded layer is two times that of the flattened insulating film, the deposition is stopped, and the substrate is conveyed to a CDE etching apparatus connected to the bias sputter apparatus via a gate valve. An etching gas composed of a $CF_4$ gas and an $O_2$ gas is used, and etching is performed under conditions which cause the ratio of the etching rate of the amorphous silicon and that of the single crystal silicon to be 2:1. All of the amorphous silicon on the insulating film can be removed when etching is stopped when the thickness of the embedded layer is the same as that of the insulating film. Hence, only the embedded layer forming the same surface with the insulating film can be realized. Then, the substrate is conveyed to a capacity-coupled type plasma CVD apparatus connected to the CDE apparatus via a gate valve, and the amplifying layer 407 serving as the photo-conductive film, the light absorbing layer 408 and the charge injection inhibition layer 409 are formed. The step-back structure layer 411 is formed into a composition-changed layer in which the composition ratio of carbon and silicon or that of germanium and silicon is continuously changed so as to have a continuous inhibition band width from amorphous silicon carbide to amorphous silicon germanium. The composition-changed layer is formed by the following method. As the raw material gas, $SiH_4$, $GeH_4$, $CH_4$ and $H_2$ are used, and the flow rate of each of the raw material gases is controlled by an individual mass-flow controller (hereinafter called an "MFC") before it is supplied to a film forming chamber. The MFC is controlled by a computer so that the gas flow rate is controlled in order to obtain a desired inhibition band width profile. First, deposition is commenced by using $SiH_4$, $CH_4$ and $H_2$ as the raw material gases. Simultaneously with the commencement of the deposition, the flow rate of the $CH_4$ gas is decreased at a predetermined rate. When the flow rate of the $CH_4$ gas is lowered to zero, the $GeH_4$ gas is increased at a predetermined rate. When the composition-changed layer 411 has been thickened to a desired thickness, discharge is stopped. That is, the flow rate of the $GeH_4$ gas and that of the $CH_4$ gas are controlled so as to obtain a desired inhibition width profile with respect to the thickness of a desired composition-changed layer. In this embodiment, the flow rates are controlled so as to make the thickness of one step-back structure layer to be about 200Å, the minimum inhibition band width Eg2 to be 1.3 eV and the maximum inhibition band width Eg3 to be 2.4 eV. The aforesaid process is repeated, so that five step-back structure layers 411 are formed. Then, $SiH_4$ and $H_2$ gases are selected from the aforesaid raw material gases, so that an amorphous silicon layer 408 serving as the light absorbing layer is formed. Then, $B_2H_6$ is added to the raw material gas so that a p-type amorphous silicon layer 409 is formed to have a thickness of 500Å. The vacuum chamber for forming the embedded layer and the vacuum chamber for forming the photo-conductive film are connected to each other via the gate valve, so that the embedded layer to the photo-conductive film can be continuously formed in a vacuum atmosphere. Finally, the ITO 404 serving as the transparent electrode is formed by a sputtering method, so that the method of manufacturing the laminated-type solid-state image sensing apparatus according to the present invention is realized.

Although the substrate having the nMOS semiconductor circuit formed thereon is used in the aforesaid embodiment, the method of manufacturing the laminated-type solid-state image sensing apparatus according to the present invention is not limited to the MOS semiconductor circuit substrate. For example, a semiconductor circuit substrate having devices such as CCD, SIT and/or bipolar may be used.

(Embodiment 8)

In this embodiment, a bipolar-type solid-state image sensing apparatus is used as the semiconductor circuit substrate having a bipolar transistor and a photo-conductive film is stacked on it. FIG. 18 is a schematic cross sectional view which illustrates a portion including a light receiving portion of this embodiment. An equivalent circuit to one pixel is the same as that shown in FIG. 15, and the circuit for the overall body of the apparatus is the same as that shown in FIG. 16. Referring to FIG. 18, an n⁻ layer 502 which is made to be a collector region due to an epitaxial growth is formed on an n-type silicon substrate 501, and a p-base region 503 and an n⁺ emitter region 504 are formed in the n⁻ layer 502, so that a bipolar transistor is formed. The p-base region 503 is separated from adjacent pixels, and each gate electrodes 506 is formed between adjacent p-base regions 503 when viewed in the horizontal direction while interposing an oxide film 505. Therefore, a p-channel MOS transistor, in which the adjacent p-base regions 503 are made to be source and drain regions, is constituted. Gate electrodes 506 also serve as capacitors for controlling the electric potential of the p-base regions 503.

After an insulating layer 507 has been formed, an emitter electrodes 508 is formed. Then, an insulating layer 509 is formed and flattening is performed before the insulating layers 507, 509 and the oxide film 505 are etched so that a contact hole is formed in the base region 503, so that a p-type single crystal silicon 510 serving as an embedded layer is deposited by an HR-CVD method. When the embedded layer is thickened to the same thickness of the flattened insulating film the deposition is stopped. The etching rate of the amorphous silicon on the insulating film and that of the single crystal silicon is larger than 100:1, so that the single crystal silicon is not substantially etched and only the amorphous silicon can be removed.

Then, an RF plasma CVD method is employed to continuously form composition changed layers 517 having a step back structure and serving as a multiplying layer 307, an amorphous silicon 513 serving as a light absorbing layer, and an n-type amorphous silicon 514 serving as a charge injection inhibition layer are continuously formed, so that an ITO of a transparent electrode 515 is formed. Furthermore, a collector electrode 516 is ohomic-connected to the reverse side of the substrate 501.

Therefore, an equivalent circuit to one pixel is, as shown in FIG. 15 expressed by a base of a bipolar transistor 731 to which a p-channel MOS transistor 732, a capacitor 733 and a photoelectric conversion device 734 are connected, a terminal 735 for applying an electric potential to the base, a p-channel MOS transistor 732, a terminal for activating a capacitor 733, a sensor electrode 737, an emitter electrode 738 and a collector electrode 739.

Then, a laminated-type solid-state image sensing apparatus which is common to Embodiments 9 and 10, and in which carrier multiplying layer, a light absorbing layer and a charge injection inhibition layer are used as photo-conductive films will now be described.

FIG. 22 is a schematic cross sectional view which illustrates the structure of the aforesaid laminated-type solid-state image sensing apparatus. Reference numeral 301 represents a semiconductor substrate, 302 represents a signal charge storage portion, and 303 represents a portion in which a circuit such as a signal reading circuit will be formed. Although FIG. 22 illustrates an nMOS transistor as an example of the signal reading circuit, it may be a CCD, an SIT or a bipolar transistor. Reference numeral 304 represents an insulating film, and 305 represents an embedded layer. The photo-conductive film is formed by stacking a multiplying layer 307, a light absorbing layer 308 and a charge injection inhibition layer 309.

Then, a method of manufacturing the laminated-type solid-state image sensing apparatus according to the present invention will now be described briefly.

Figure 23A:
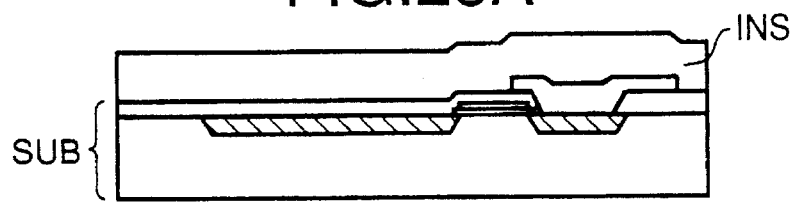
FIGS. 23A to 23E are schematic cross sectional views which illustrate a process of manufacturing a solid-state image sensing apparatus commonly adapted to Embodiments 9 and 10 of the present invention.
Figure 23B:
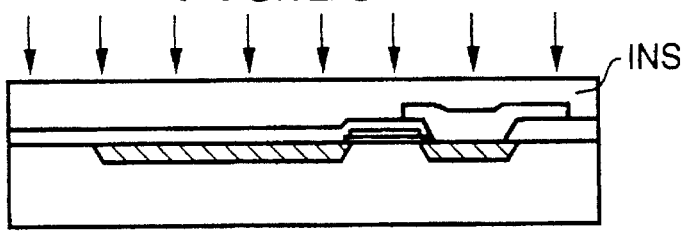
Figure 23C:
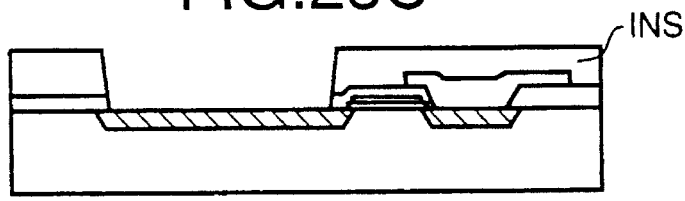
Figure 23D:
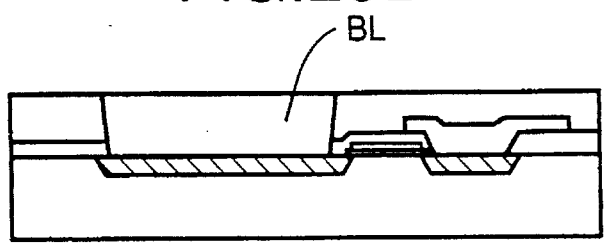
Figure 23E:
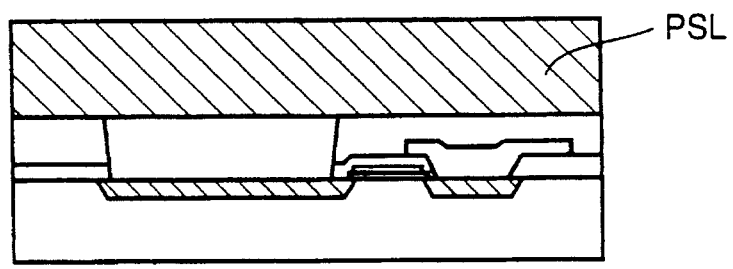

First, an insulating layer (INS) is deposited after a semiconductor circuit substrate (SUB) has been formed (see FIG. 23A). Then, the aforesaid insulating layer is flattened in order to reduce the projections and pits on the surface on which the photo-conductive film will be formed (see FIG. 23B). Then, the insulating layer above the signal charge storage portion is removed (see FIG. 23C). Then, the embedded layer BL is selectively deposited on only the signal charge storage portion (see FIG. 23D). The deposition of the embedded layer BL can be effectively performed by causing a $SiH_4$ gas and a $F_2$ gas to react with each other in a gas phase to form a deposition precursor is formed and it is transported onto the substrate, that is, a chemical deposition method. With the aforesaid method, epitaxial growth takes place on the single crystal by optimizing the flow rate ratio of the $SiH_4$ gas and the $F_2$ gas, and the temperature of the substrate. Furthermore, doping can be performed by mixing a $PH_3$ or $B_2H_6$ gas with the raw material gas. After the embedded layer has been deposited to the same level as the insulating layer, a photo-conductive film is deposited (see FIG. 23E). Thus, the laminated-type solid-state image sensing apparatus can be manufactured.

Then, the method of manufacturing the laminated-type solid-state image sensing apparatus according to the present invention and a conventional method of manufacturing the laminated-type solid-state image sensing apparatus will be subjected to a comparison.

When the laminated-type solid-state image sensing apparatus is manufactured by the method according to the present invention, patterning must be performed only at the time of forming the contact hole in the silicon oxide film (see FIG. 23A). On the contrary, patterning must be performed four times in the conventional manufacturing method. Therefore, the patterning process can be significantly simplified with the manufacturing method according to the present invention. Furthermore, a third silicon oxide film required in the conventional laminated solid-state image sensing apparatus can be omitted from the solid-state image sensing apparatus according to the present invention. Since the embedded layer is selectively formed on only the storage portion with the method according to the present invention, the process of forming the embedded layer to the process of forming the photo-conductive film can be continuously performed in a vacuum atmosphere. Therefore, the interface between the embedded layer and the photo-conductive film can be protected from contamination, causing dark-current characteristics and afterimage characteristics to be improved.

(Embodiment 9)

An embodiment of a method of manufacturing a laminated solid-state image sensing apparatus according to the present invention will now be described with reference to FIG. 17.

In this embodiment, a laminated solid-state image sensing apparatus is formed by stacking a photo-conductive film on a semiconductor circuit substrate having an nMOS device formed thereon. First, an oxide film/nitride film is formed on a p-type single crystal silicon substrate 101, and then patterning is performed. By using it as a mask, a channel stopper and a field oxide film are formed, the oxide film/nitride film in an active region are removed, a gate oxide film 106 is formed by a heat oxidation method, and then channel doping is performed by employing an ion injection method. Then, a polysilicon film is deposited by a CVD method and P is dispersed in order to reduce the resistance, and patterning is performed, so that a polysilicon gate electrode 107 is formed. Then, As is injected by using an ion injection method, so that a source region 104 and a drain region 105 are formed. At this time, the polysilicon gate electrode 107 serves as a mask, so that the overlap of the gate, the source and the drain is reduced considerably. In this case, a pn diode composed of the source region 104 and the p-type single crystal silicon substrate 101 serves as a signal charge storage portion. Then, a first silicon oxide film 108 is deposited as an interlayer insulating film by using a CVD method, and patterning is performed, so that a contact hole is formed, and then a wiring electrode 109 is formed. Then, a second silicon oxide film 111 is deposited as an interlayer insulating film, and a resist is applied, so that a flat surface is formed. Then, etching is performed by using RIE under a condition that the etching rate of the resist and that of the silicon oxide film are made to be the same, so that the silicon oxide film is flattened. Then, the silicon oxide film on the source region is etched, so that a contact hole is formed. The contact hole is formed in such a manner that an ordinary photolithography method is used, so that a resist pattern is formed, and then a RIE apparatus is used to perform etching. An etching gas composed of $CF_4$ gas and $O_2$ gas is used. After the contact hole has been formed, the embedded layer is selectively deposited. The embedded layer is formed by selectively causing a low-resistance n-type single crystal silicon 401 to subject an epitaxial growth. The selective epitaxial growth is caused by using a raw material gas composed of $SiH_4$, $F_2$ (diluted to 10% by He) and $PH_3$ (diluted to 1% by $H_2$) is used. The substrate is kept at 390° C. in a vacuum chamber and $SiH_4$ is allowed to flow by 15 SCCM. Then, $F_2$/He is allowed to flow by 300 SCCM, and then the flow rate of $SiH_4$ is increased to 30 SCCM in a period of 80 seconds, so that deposition is performed. When the embedded layer has been enlarged to form the same level with the insulating layer, the supply of the gas is stopped. Then, a capacity coupled type plasma CVD apparatus is used, so that a multiplying layer 407, a light absorbing layer 408 and a charge injection inhibition layer 409 are formed. The step-back structure layer 411 is formed into a composition-changed layer in which the composition ratio of carbon and silicon or that of germanium and silicon is continuously changed so as to have a continuous inhibition band width from amorphous silicon carbide to amorphous silicon germanium. The composition-changed layer is formed by the following method. As the raw material gas, $SiH_4$, $GeH_4$, $CH_4$ and $H_2$ are used, and the flow rate of each of the raw material gases is controlled by an individual mass-flow controller (hereinafter called an "MFC") before it is supplied to a film forming chamber. The MFC is controlled by a computer so that the gas flow rate is controlled in order to obtain a desired inhibition band width profile. First, deposition is commenced by using $SiH_4$, $CH_4$ and $H_2$ as the raw material gases. Simultaneously with the commencement of the deposition, the flow rate of the $CH_4$ gas is decreased at a predetermined rate. When the flow rate of the $CH_4$ gas is lowered to zero, the $GeH_4$ gas is increased at a predetermined rate. When the composition-changed layer 411 has been thickened to a desired thickness, discharge is stopped. That is, the flow rate of the $GeH_4$ gas and that of the $CH_4$ gas are controlled so as to obtain a desired inhibition width profile with respect to the thickness of a desired composition-changed layer. In this embodiment, the flow rates are controlled so as to make the thickness of one step-back structure layer to be about 200Å, the minimum inhibition band width Eg2 to be 1.3 eV and the maximum inhibition band width Eg3 to be 2.7 eV. The aforesaid process is repeated, so that five step-back structure layers 411 are formed. Then, $SiH_4$ and $H_2$ gases are selected from the aforesaid raw material gases, so that an amorphous silicon layer 408 serving as the light absorbing layer is formed. Then, $B_2H_6$ is added to the raw material gas so that a p-type amorphous silicon layer 409 is formed to have a thickness of 500Å. The vacuum chamber for forming the embedded layer and the vacuum chamber for forming the photo-conductive film are connected to each other via the gate valve, so that the embedded layer to the photo-conductive film can be continuously formed in a vacuum atmosphere. Finally, the ITO 404 serving as the transparent electrode is formed by a sputtering method, so that the method of manufacturing the laminated solid-state image sensing apparatus according to the present invention is realized.

Although the substrate having the nMOS semiconductor circuit formed thereon is used in the aforesaid embodiment, the method of manufacturing the laminated solid-state image sensing apparatus according to the present invention is not limited to the MOS semiconductor circuit substrate. For example, a semiconductor circuit substrate having devices such as CCD, SIT and/or bipolar may be used.

(Embodiment 10)

In this embodiment, a semiconductor substrate having a bipolar transistor is used, and a photo-conductive film is stacked on it. A schematic cross sectional view of a portion including a light receiving portion of this embodiment is the same as that shown in FIG. 18, an equivalent circuit diagram for one pixel and an equivalent circuit diagram for the overall body of the apparatus respectively are the same as FIGS. 15 and 16. Referring to FIG. 17, an n⁻ layer 502 which is made to be a collector region due to epitaxial growth is formed on an n-type silicon substrate 501, and a p-base region 503 and an n⁺ emitter region 504 are formed in the n⁻ layer 502, so that a bipolar transistor is formed. The p-base region 503 is separated from adjacent pixels, and each gate electrodes 506 is formed between adjacent p-base regions 503 when viewed in the horizontal direction while interposing an oxide film 505. Therefore, a p-channel MOS transistor, in which the adjacent p-base regions 503 are made to be source and drain regions, is constituted. Gate electrodes 506 also serve as capacitors for controlling the electric potential of the p-base regions 503.

After an insulating layer 507 has been formed, emitter electrode 508 is formed. Then, an insulating layer 509 is formed and flattening is performed before the insulating layers 507, 509 and the oxide film 505 are etched so that a contact hole is formed in the base region 503, so that a p-type polycrystal silicon 510 serving as an embedded layer for use to plug the contact hole is formed.

Then, an RF plasma CVD method is employed to continuously form three composition-changed layers 517 having a step back structure as the amplifying layer 307, an amorphous silicon 513 serving as a light absorbing layer, and an n-type amorphous silicon 514 serving as the charge injection inhibition layer, so that an ITO of a transparent electrode 515 is formed. Furthermore, a collector electrode 516 is ohmic-connected to the reverse side of the substrate 501.

Therefore, an equivalent circuit to one pixel is, as shown in FIG. 15 expressed by a base of a bipolar transistor 731 to which a p-channel MOS transistor 732, a capacitor 733 and a photoelectric conversion device 734 are connected, a terminal 735 for applying an electric potential to the base, a p-channel MOS transistor 732, a terminal for activating a capacitor 733, a sensor electrode 737, an emitter electrode 738 and a collector electrode 739.

Figure 24:
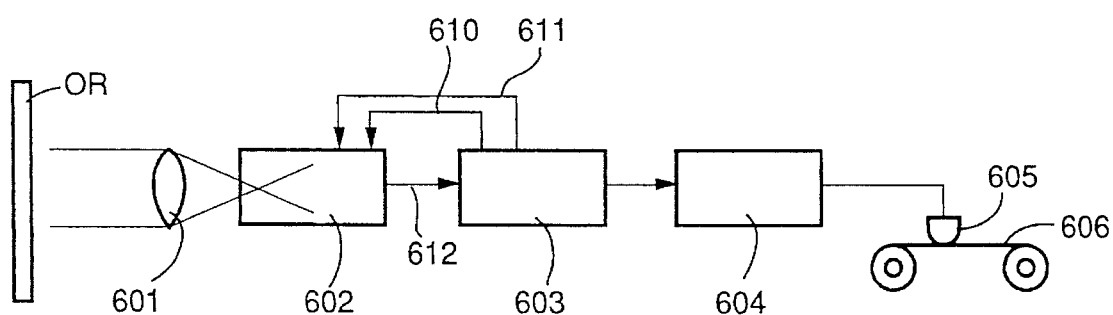
FIG. 24 is a block diagram which illustrates an information processing apparatus according to the present invention.

FIG. 24 is a block diagram which illustrates the structure of an information processing apparatus such as a communication system, a facsimile machine or a video recorder which uses the solid-state image sensing apparatus according to the present invention.

Symbol OR represents an original document on which image information or the like is formed, 610 represents an image-forming lens, and 602 represents a solid-state image sensing apparatus according to the present invention.

Reference numeral 603 represents a control circuit including a central processing unit (CPU), a drive control circuit and a signal processing circuit, the control circuit being connected to the solid-state image sensing apparatus 602 via an input line 612, an output line 610 for activating the APD, and a power supply line 611.

Reference numeral 604 represents a recording control circuit which is connected to a recording head so as to write information read by the solid-state image sensing apparatus on a recording medium 606.

The recording head 605 is a magnetic head in a video recorder, and is a thermal head or an ink jet head in a facsimile machine. In the case of a communication system, the recording head 605 is replaced by a recording apparatus disposed individual position via a cable.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:
1. A solid-state image sensing apparatus comprising:
a substrate having a plurality of charge storage portions capable of storing charges and an output circuit for outputting a signal in accordance with the charges stored in said storage portions;
an insulating film formed on the surface of said substrate and having a plurality of openings, each of said openings formed above each respective charge storage portion; and
a columnar embedded region formed within each of said openings and the surface of said insulating film and that of said embedded regions are substantially flattened;
a photosensitive layer of an intrinsic or non-doped semiconductor formed on said insulating film and electrically connected to said charge storage portions via said embedded regions, wherein
each of said embedded regions comprises a P-type or N-type doped semiconductor region provided in direct contact with said photosensitive layer to form pi or ni contact between said photosensitive layer and said embedded region and wherein said opening has a substantially vertical side wall.
2. A solid-state image sensing apparatus according to claim 1, wherein said photosensitive layer includes an avalanche photodiode.
3. A solid-state image sensing apparatus according to claim 1, wherein said photosensitive layer has a multiplying layer formed on said embedded region and a light absorbing layer formed on said multiplying layer.
4. A solid-state image sensing apparatus according to claim 3, wherein said multiplying layer has a plurality of stacked regions in each of which a band gap is continuously changed and an energy step is formed between said regions.
5. A solid-state image sensing apparatus according to claim 1, wherein said output circuit includes switches disposed to correspond to unit cells and a drive circuit for driving said switches.
6. A solid-state image sensing apparatus according to claim 1, wherein said storage region is a portion of a transistor which constitutes said output circuit.
7. A method of manufacturing a solid-state image sensing apparatus having:
a substrate having a charge storage portion capable of storing charges and an output circuit for outputting a signal in accordance with the charges stored in said storage portion;
an insulating film formed on the surface of said substrate and having an opening formed above said charge storage portion; and
a photosensitive layer formed on said insulating film and electrically connected to said charge storage portion via said opening, said method of manufacturing a solid-state image sensing apparatus comprising the steps of:
forming said insulating film on said substrate;
forming an embedded region within said opening;
flattening the surface of said embedded region and that of said insulating film; and
forming said photosensitive layer on said insulating film.
8. A method of manufacturing a solid-state image sensing apparatus according to claim 7, wherein said flattening process is performed in such a manner that forming of an amorphous semiconductor on said insulating layer and forming of a crystalline semiconductor in said opening are simultaneously performed, and then the entire surface is etched, so that said amorphous semiconductor is removed.

9. A method of manufacturing a solid-state image sensing apparatus according to claim 7, wherein said flattening process is performed in such a manner that said insulating layer is flattened by etching, and then a material which constitutes said embedded region is deposited in said opening by a selective deposition method.

10. A solid-state image sensing apparatus according to claim 1, wherein said output circuit is connected to an external circuit which generates a signal for activating said output circuit.

11. An apparatus comprising:

a solid-state image sensing apparatus according to claim 1, and recording means for recording an image picked up by said apparatus.

12. An apparatus according to claim 1, wherein said photosensitive layer comprises a non-monocrystalline semiconductor.

13. An apparatus according to claim 1, wherein said photosensitive layer comprises a non-monocrystalline semiconductor a main component of which is Si, Ge or C.

14. An apparatus according to claim 1, 12 or 13, wherein said embedded regions comprise microcrystalline semiconductors.

15. An apparatus according to claim 1, further comprising a p- or n- type semiconductor layer provided on said photosensitive layer.

16. An apparatus according to claim 1, wherein said photosensitive layer comprises a material selected from the group consisting of amorphous Si, amorphous SiGe, amorphous SiC and amorphous SiGeC.

* * * * *

UNITED STATES PATENT AND TRADEMARK OFFICE
CERTIFICATE OF CORRECTION

PATENT NO. : 5,557,121

DATED : September 17, 1996

INVENTORS : HIRAKU KOZUKA ET AL.

Page 1 of 3

It is certified that error appears in the above-identified patent and that said Letters Patent is hereby corrected as shown below:

ON TITLE PAGE

At [56] References Cited

"Nocholas" should read --Nicholas--.

COLUMN 1

Line 23, "desire" should read --need for--;
Line 24, "of" should be deleted.

COLUMN 6

Line 5, after "Pat." insert --Appl'n.--;
Line 6, "667,400" should read --07/667,400--;
Line 12, "take" should read --cause--;
Line 13, "place" should be deleted;
Line 42, "Eg2<Eg1<Eg2" should read --Eg2<Eg1<Eg3--.

COLUMN 7

Line 8, "devices," should read --device,--.

COLUMN 9

Line 44, "electrodes" should read --electrode--;

UNITED STATES PATENT AND TRADEMARK OFFICE
CERTIFICATE OF CORRECTION

PATENT NO. : 5,557,121

DATED : September 17, 1996

INVENTORS : HIRAKU KOZUKA ET AL.

It is certified that error appears in the above-identified patent and that said Letters Patent is hereby corrected as shown below:

COLUMN 9 continued

Line 62, "ohomic-connected" should read --ohmic-connected--

COLUMN 13

Line 10, "electrodes" should read --electrode--;
   Line 39, "revere" should read --reverse--.

COLUMN 17

Line 51, "electrodes" should read --electrode--.

UNITED STATES PATENT AND TRADEMARK OFFICE
CERTIFICATE OF CORRECTION

PATENT NO. : 5,557,121

DATED : September 17, 1996

INVENTORS : HIRAKU KOZUKA ET AL.

Page 3 of 3

It is certified that error appears in the above-identified patent and that said Letters Patent is hereby corrected as shown below:

<u>COLUMN 21</u>

Line 26, "ohomic-connected" should read --ohmic-connected--.

<u>COLUMN 24</u>

Line 5, "to claim" should read --to any one of claims--.

Signed and Sealed this

Fourth Day of March, 1997

Attest:

BRUCE LEHMAN

*Attesting Officer*  *Commissioner of Patents and Trademarks*